(12) United States Patent
Ogata et al.

(10) Patent No.: US 11,811,125 B2
(45) Date of Patent: Nov. 7, 2023

(54) POWER DISTRIBUTION/COUPLING CIRCUIT AND POWER DISTRIBUTION/COUPLING COMPONENT

(71) Applicant: Murata Manufacturing Co., Ltd., Nagaokakyo (JP)

(72) Inventors: Makoto Ogata, Nagaokakyo (JP); Takuya Sato, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 468 days.

(21) Appl. No.: 17/169,878

(22) Filed: Feb. 8, 2021

(65) Prior Publication Data

US 2021/0167482 A1 Jun. 3, 2021

Related U.S. Application Data

(63) Continuation of application No. PCT/JP2019/033951, filed on Aug. 29, 2019.

(30) Foreign Application Priority Data

Aug. 30, 2018 (JP) .................. 2018-162137

(51) Int. Cl.
*H01P 5/12* (2006.01)
*H01F 27/28* (2006.01)
(Continued)

(52) U.S. Cl.
CPC ........... *H01P 5/12* (2013.01); *H01F 27/2804* (2013.01); *H01F 27/29* (2013.01); *H01F 27/40* (2013.01); *H01G 4/30* (2013.01); *H01G 4/40* (2013.01)

(58) Field of Classification Search
CPC .. H01F 17/0013; H01F 17/02; H01F 27/2804; H01F 27/29; H01F 27/40;
(Continued)

(56) References Cited

U.S. PATENT DOCUMENTS 9,887,683 B2* 2/2018 Kuribara ................. H03H 7/42
10,276,912 B2* 4/2019 Goto ....................... H01P 5/184
(Continued)

FOREIGN PATENT DOCUMENTS

JP 2000-124712 A 4/2000
JP 2000-165170 A 6/2000
(Continued)

OTHER PUBLICATIONS

Official Communication issued in International Patent Application No. PCT/JP2019/033951, dated Nov. 19, 2019.

*Primary Examiner* — Jared Fureman
*Assistant Examiner* — Nicolas Bellido
(74) *Attorney, Agent, or Firm* — KEATING & BENNETT, LLP

(57) ABSTRACT

A power distribution/coupling circuit includes a common terminal, first and second terminals, a first connection point, a first inductor connected between the first connection point and the first terminal, a second inductor connected between the first connection point and the second terminal, a first capacitor connected between an end of the first inductor closer to the first terminal and a ground, a second capacitor connected between an end of the second inductor closer to the second terminal and the ground, a third capacitor connected between the first connection point and the ground, and a resistor connected between the first terminal and the second terminal, wherein the power distribution/coupling circuit further includes a third inductor connected between the common terminal and the first connection point and a fourth capacitor connected between an end of the third inductor closer to the common terminal and the ground.

15 Claims, 15 Drawing Sheets

(51) Int. Cl.
  *H01F 27/29* (2006.01)
  *H01F 27/40* (2006.01)
  *H01G 4/30* (2006.01)
  *H01G 4/40* (2006.01)

(58) Field of Classification Search
  CPC .... H01G 4/30; H01G 4/40; H01P 5/12; H01P 5/19; H03H 7/01; H03H 7/075; H03H 7/48; Y02D 30/70
  See application file for complete search history.

(56) References Cited

U.S. PATENT DOCUMENTS

| | | | |
|---|---|---|---|
| 2017/0047904 A1 | 2/2017 | Szopko | |
| 2021/0265105 A1* | 8/2021 | Ogata | H01F 27/2804 |
| 2022/0173712 A1* | 6/2022 | Sato | H03H 7/42 |

FOREIGN PATENT DOCUMENTS

| | | | | |
|---|---|---|---|---|
| JP | 2002-280864 A | | 9/2002 | |
| JP | 2002280864 A | * | 9/2002 | |
| JP | 2002-344276 A | | 11/2002 | |
| WO | WO-2015022839 A1 | * | 2/2015 | ......... H01F 17/0006 |
| WO | 2017/027467 A1 | | 2/2017 | |

* cited by examiner

500

POWER DISTRIBUTION/COUPLING CIRCUIT AND POWER DISTRIBUTION/COUPLING COMPONENT

CROSS REFERENCE TO RELATED APPLICATIONS

This application claims the benefit of priority to Japanese Patent Application No. 2018-162137 filed on Aug. 30, 2018 and is a Continuation Application of PCT Application No. PCT/JP2019/033951 filed on Aug. 29, 2019. The entire contents of each application are hereby incorporated herein by reference.

BACKGROUND OF THE INVENTION

1. Field of the Invention

The present invention relates to a power distribution/coupling circuit, and a power distribution/coupling component including a multilayer body in which a plurality of dielectric layers are stacked in a stacking direction.

2. Description of the Related Art

A power distribution/coupling component (divider) is used in a large base station for mobile communications, such as mobile phones.

The power distribution/coupling component is used, for example, to suppress deterioration of amplification efficiency due to a low noise amplifier (LNA). That is, power is amplified by the LNA in a base station in some cases, but it is known that as input power increases, linearity of output of the LNA deteriorates and the amplification efficiency deteriorates. Therefore, two power distribution/coupling components are prepared, the power is distributed into two by the first power distribution/coupling component, and the two smaller powers are amplified by separate LNAs, the two amplified powers are coupled into one power by the second power distribution/coupling component, and thus the deterioration of the amplification efficiency of the LNA is suppressed.

Japanese Patent Application Laid-Open No. 2002-280864 discloses a power distribution/coupling component (power distribution component) that can be used for such an application. FIG. 15 shows an equivalent circuit diagram of a power distribution/coupling component 1000 disclosed in Japanese Patent Application Laid-Open No. 2002-280864.

The power distribution/coupling component 1000 includes a common input-output terminal 101 and input-output terminals 102 and 103. Two inductors L101 and L102 are connected to the common input-output terminal 101. The input-output terminal 102 is connected to the inductor L101. The input-output terminal 103 is connected to the inductor L102. A capacitor C101 is connected between a connection point between the inductor L101 and the input-output terminal 102 and a ground. A capacitor C102 is connected between a connection point between the inductor L102 and the input-output terminal 103 and the ground. A capacitor C103 is connected between the common input-output terminal 101 and the ground. A resistor R101 is connected between the input-output terminal 102 and the input-output terminal 103.

The power distribution/coupling component 1000 can distribute power input to the common input-output terminal 101 into two and output the power from the input-output terminal 102 and the input-output terminal 103. Further, the power distribution/coupling component 1000 can couple the power input to the input-output terminal 102 and the input-output terminal 103 into one and output the power from the common input-output terminal 101. This circuit included in the power distribution/coupling component 1000 is referred to as a Wilkinson power distribution circuit in some cases.

In the power distribution/coupling component 1000, isolation between the input-output terminal 102 and the input-output terminal 103 is insufficient. That is, in S32 characteristics showing the isolation between the input-output terminal 102 and the input-output terminal 103, a width of a band in which a sufficiently large attenuation is obtained is narrow.

SUMMARY OF THE INVENTION

Preferred embodiments of the present invention provide power distribution/coupling circuits and power distribution/coupling components.

A power distribution/coupling circuit according to a preferred embodiment of the present invention includes a common terminal, a first terminal, a second terminal, a first connection point connected to the common terminal, a first inductor connected between the first connection point and the first terminal, a second inductor connected between the first connection point and the second terminal, a first capacitor shunt-connected between an end of the first inductor closer to the first terminal and a ground, a second capacitor shunt-connected between an end of the second inductor closer to the second terminal and the ground, a third capacitor shunt-connected between the first connection point and the ground, a resistor connected between the first terminal and the second terminal, in which the power distribution/coupling circuit distributes electric power input to the common terminal at the first connection point and outputs the electric power from the first terminal and the second terminal, or couples the electric power input to the first terminal and the second terminal at the first connection point and outputs the electric power from the common terminal, and the power distribution/coupling circuit further includes a third inductor connected between the common terminal and the first connection point, and a fourth capacitor shunt-connected between an end of the third inductor closer to the common terminal and the ground.

A power distribution/coupling component according to a preferred embodiment of the present invention includes a multilayer body including a plurality of dielectric layers that are stacked in a stacking direction, a first inductor conductor and a second inductor conductor each including a winding axis in the stacking direction, a connecting conductor connecting a first end of the first inductor conductor and a first end of the second inductor conductor, a third inductor conductor including a winding axis in the stacking direction and a first end connected to the connecting conductor, a first capacitor conductor connected to a second end of the first inductor conductor, a second capacitor conductor connected to a second end of the second inductor conductor, a third capacitor conductor connected to the connecting conductor, a fourth capacitor conductor connected to a second end of the third inductor conductor, and a ground conductor, wherein the ground conductor is disposed so as to generate a capacitance with each of the first capacitor conductor, the second capacitor conductor, the third capacitor conductor, and the fourth capacitor conductor, and when the multilayer body is viewed in a perspective plan view from the stacking direction, the first inductor conductor and the second inductor conductor each include an air core portion including the winding axis, and the air core portion of the first inductor conductor does not overlap with the connecting conductor, and the air core portion of the second inductor conductor does not overlap with the connecting conductor.

A power distribution/coupling component according to a preferred embodiment of the present invention includes a multilayer body including a plurality of dielectric layers that are stacked in a stacking direction, a common external terminal, a first external terminal, a second external terminal, a connecting conductor, a first inductor conductor including a winding axis in the stacking direction, a first end connected to the connecting conductor, and a second end connected to the first external terminal, a second inductor conductor including a winding axis in the stacking direction, a first end connected to the connecting conductor, and a second end connected to the second external terminal, a third inductor conductor including a winding axis in the stacking direction, a first end connected to the common external terminal, and a second end connected to the connecting conductor, a first capacitor conductor connected to the second end of the first inductor conductor, a second capacitor conductor connected to the second end of the second inductor conductor, a third capacitor conductor connected to the connecting conductor, a fourth capacitor conductor connected to the first end of the third inductor conductor, wherein the ground conductor is disposed so as to generate a capacitance with each of the first capacitor conductor, the second capacitor conductor, the third capacitor conductor, and the fourth capacitor conductor, when the multilayer body is viewed in a perspective plan view from the stacking direction, the first inductor conductor, the second inductor conductor, and the third inductor conductor each include an air core portion including the winding axis, at least a portion of the air core portion of the third inductor conductor is sandwiched between the air core portion of the first inductor conductor and the air core portion of the second inductor conductor, a winding direction from the first end to the second end of the first inductor conductor is different from a winding direction from the first end to the second end of the second inductor conductor, and when a direction in which the air core portion of the first inductor conductor and the air core portion of the second inductor conductor are arranged as viewed in a perspective plan view from the stacking direction of the multilayer body is defined as an arrangement direction of the first inductor conductor and the second inductor conductor, in the arrangement direction, the winding direction of an outermost first portion of the first inductor conductor and the winding direction of an outermost first portion of the second inductor conductor are a same direction, and the winding direction of a second portion of the first inductor conductor facing the first end of the first inductor conductor with the air core portion interposed between the second portion of the first inductor conductor and the first end of the first inductor conductor and the winding direction of a second portion of the second inductor conductor facing the first end of the second inductor conductor with the air core portion interposed between the second portion of the second inductor conductor and the first end of the second inductor conductor in a direction intersecting the arrangement direction at a right angle are inwardly opposing directions in the arrangement direction.

In the power distribution/coupling circuits according to preferred embodiments of the present invention, good isolation is obtained between the first terminal and the second terminal. That is, the power distribution/coupling circuits according to preferred embodiments of the present invention each have a wide band in which sufficiently large attenuation is obtained in the S32 characteristics.

Further, in the power distribution/coupling components according to preferred embodiments of the present invention, power distribution/coupling circuits according to preferred embodiments of the present invention can be easily provided. Further, in the power distribution/coupling components according to preferred embodiments of the present invention, the air core portion of the first inductor conductor and the air core portion of the second inductor conductor do not overlap with the connecting conductor when the multilayer body is viewed in a perspective plan view from the stacking direction. Thus, the first inductor conductor and the second inductor conductor can provide a magnetic flux without being hindered by the connecting conductor.

Further, in the power distribution/coupling components according to preferred embodiments of the present invention, the power distribution/coupling circuits according to preferred embodiments of the present invention can be easily provided. Further, in the power distribution/coupling components according to preferred embodiments of the present invention, a width of a band having a small return loss is able to be widened.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
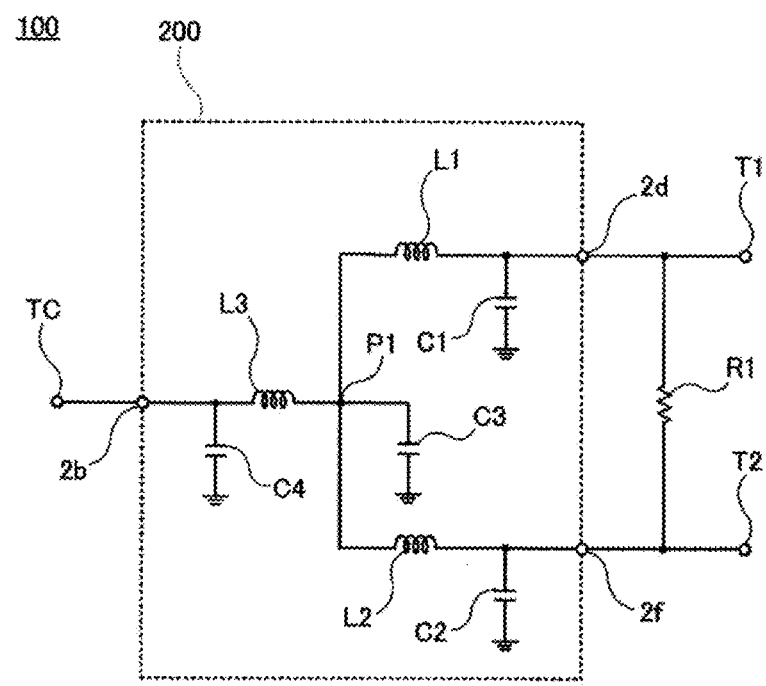
FIG. 1 is an equivalent circuit diagram of a power distribution/coupling circuit 100 according to a first preferred embodiment of the present invention.

Hereinafter, preferred embodiments of the present invention will be described with reference to the drawings.

It should be noted that each preferred embodiment is an example of a preferred embodiment of the present invention, and the present invention is not limited to the contents of the preferred embodiments. It is also possible to combine the contents described in different preferred embodiments, and the contents of the preferred embodiments are also included in the present invention. Further, the drawings are for the purpose of assisting the understanding of the specification, and may be drawn schematically. The elements or the ratio of the dimensions between the elements do not match the ratio of the dimensions of those described in the specification in some cases. In addition, the elements described in the specification may be omitted in the drawings, or may be drawn by omitting some of the elements.

First Preferred Embodiment

Power Distribution/Coupling Circuit 100

FIG. 1 shows an equivalent circuit diagram of a power distribution/coupling circuit 100 according to a first preferred embodiment of the present invention. In FIG. 1, a portion of the circuit is surrounded by a broken line, and as will be described later, this portion is defined by a power distribution/coupling component 200 in the present preferred embodiment.

The power distribution/coupling circuit 100 includes a common terminal TC, a first terminal T1, and a second terminal T2. Further, the power distribution/coupling circuit 100 includes a first connection point P1.

A first inductor L1 is connected between the first connection point P1 and the first terminal T1. Further, a second inductor L2 is connected between the first connection point P1 and the second terminal T2.

A first capacitor C1 is shunt-connected between an end of the first inductor L1 closer to the first terminal T1 and a ground. Further, a second capacitor C2 is shunt-connected between an end of the second inductor L2 closer to the second terminal T2 and the ground. Further, a third capacitor C3 is shunt-connected between the first connection point P1 and the ground. Note that the shunt connection refers to connecting an object between an arbitrary point in the circuit and the ground.

The third capacitor C3 can also be considered as a capacitor in which a virtual capacitor CX (not shown) is shut-connected between the end of the first inductor L1 closer to the first connection point P1 and the ground, a virtual capacitor CY (not shown) is shunt-connected between the end of the second inductor L2 closer to the first connection point P1 and the ground, and the virtual capacitor CX and the virtual capacitor CY are added together.

A resistor R1 is connected between the first terminal T1 and the second terminal T2.

A third inductor L3 is connected between the common terminal TC and the first connection point P1. Further, a fourth capacitor C4 is shunt-connected between an end of the third inductor L3 closer to the common terminal TC and the ground. The power distribution/coupling circuit 100 is provided with the third inductor L3 and the fourth capacitor C4 in order to obtain good isolation between the first terminal T1 and the second terminal T2.

The power distribution/coupling circuit 100 can distribute the power input to the common terminal TC into two and output the power from the first terminal T1 and the second terminal T2. Further, the power distribution/coupling circuit 100 can couple the power input to the first terminal T1 and the second terminal T2 into one and output the power from the common terminal TC.

Power Distribution/Coupling Component 200

As described above, in the present preferred embodiment, a portion of the circuit of the power distribution/coupling circuit 100 surrounded by the broken line in FIG. 1 is defined by the power distribution/coupling component 200.

Figure 2:
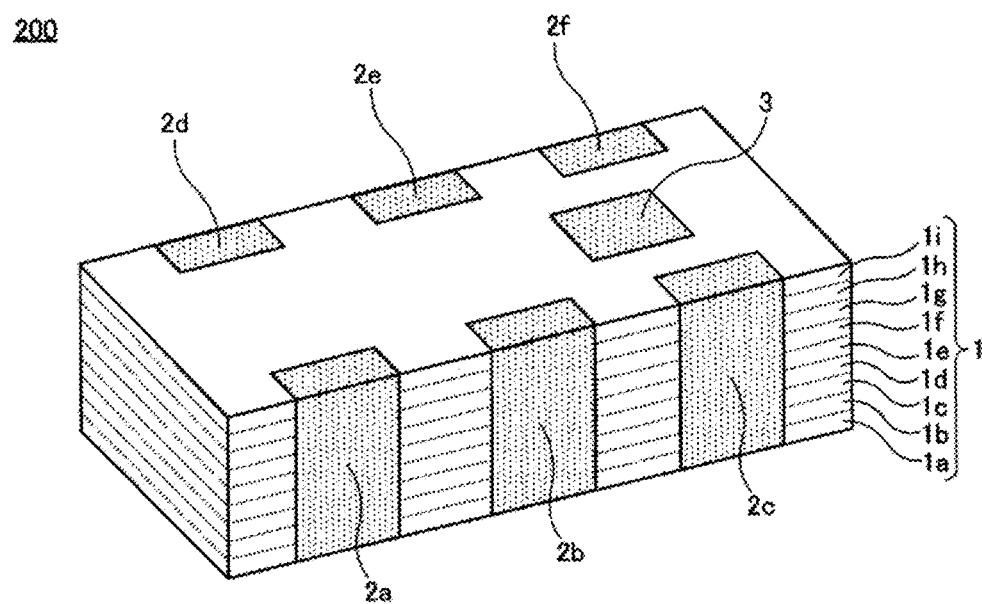
FIG. 2 is a perspective view of a power distribution/coupling component 200 according to the first preferred embodiment of the present invention.
Figure 3:
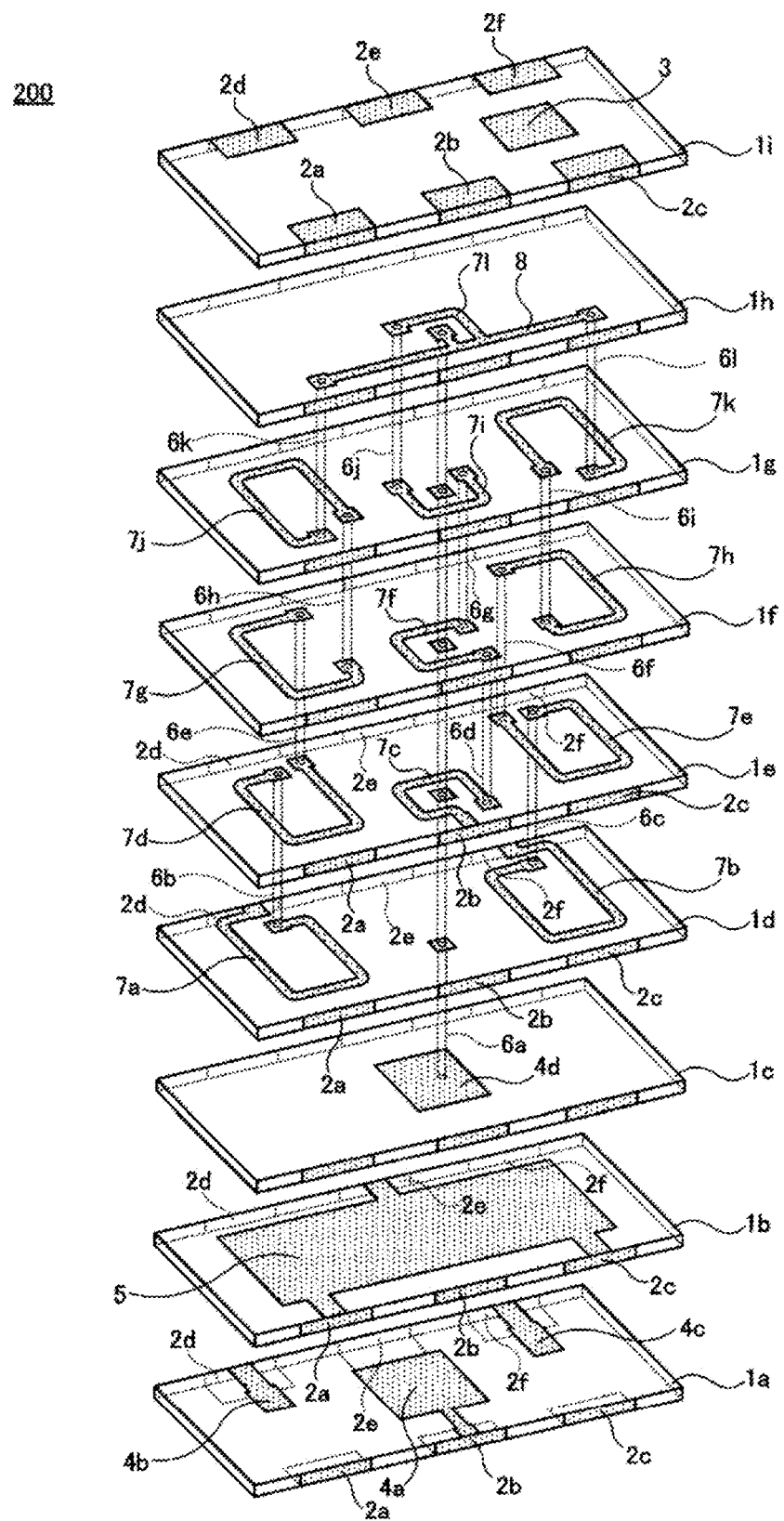
FIG. 3 is an exploded perspective view of the power distribution/coupling component 200.
Figure 4:
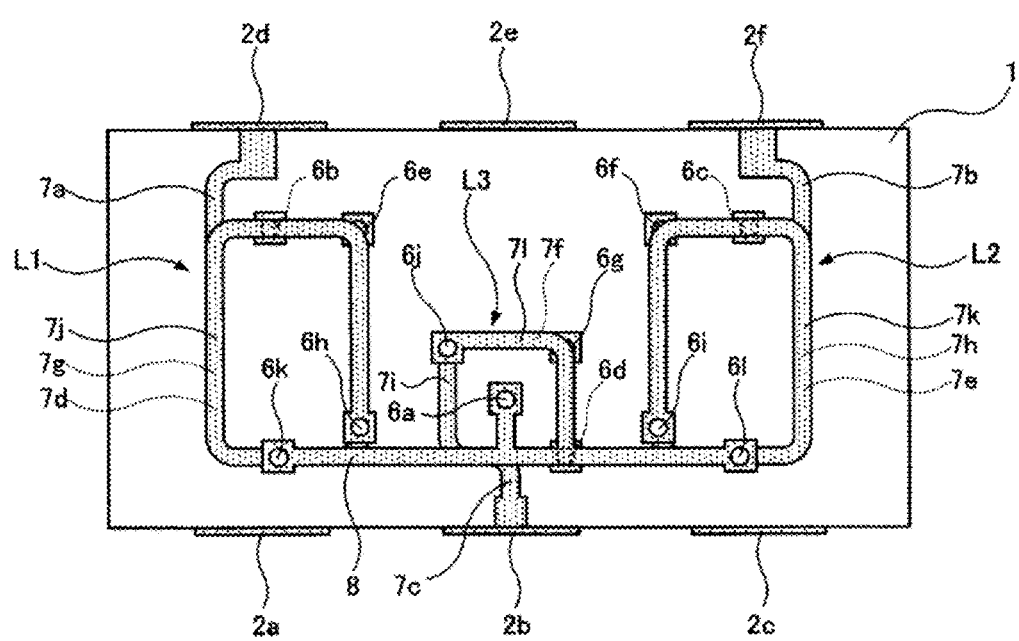
FIG. 4 is a perspective view of the power distribution/coupling component 200 viewed from a stacking direction in a plan view.

FIGS. 2, 3, and 4 show the power distribution/coupling component 200. FIG. 2 is a perspective view of the power distribution/coupling component 200. FIG. 3 is an exploded perspective view of the power distribution/coupling component 200. FIG. 4 is a perspective view showing a via conductor, an inductor conductor, and a connecting conductor formed inside the power distribution/coupling component 200 when viewed in a plan view from a stacking direction.

The power distribution/coupling component 200 includes a multilayer body 1 in which a plurality of dielectric layers $1a$ to $1i$ are stacked. The multilayer body 1 may have any suitable shape, but in the present preferred embodiment, preferably has a rectangular or substantially rectangular parallelepiped shape including a lower main surface, an upper main surface, and four side surfaces connecting the lower main surface and the upper main surface.

A material of the multilayer body 1 (dielectric layers $1a$ to $1i$) is not particularly limited, but low temperature co-fired ceramic (LTCC), for example, is preferably used in the present preferred embodiment.

Six external terminals $2a$ to $2f$ are provided on an outer surface of the multilayer body 1. The six external terminals $2a$ to $2f$ are provided separately on a front side surface and a back side surface of the multilayer body 1 in FIG. 2. Specifically, the three external terminals $2a$ to $2c$ are provided on the front side surface of the multilayer body 1, and the three external terminals $2d$ to $2f$ are provided on the back side surface of the multilayer body 1. The external terminals $2a$ to $2f$ are mainly provided on the side surfaces of the multilayer body 1. Lower ends of the external terminal $2a$ to $2f$ extend to a lower main surface of the multilayer body 1, and upper ends of the external terminals $2a$ to $2f$ extend to an upper main surface of the multilayer body 1.

Of the six external terminals $2a$ to $2f$, the external terminal $2b$ is a common external terminal, the external terminal $2d$ is a second external terminal, the external terminal $2f$ is a third external terminal, and the external terminals $2a$, $2c$, and $2e$ are ground external terminals.

A directional identification mark 3 is provided on the upper main surface of the multilayer body 1.

The external terminals $2a$ to $2f$ and the directional identification mark 3 may have any structure and be made of any material, but in the present preferred embodiment, preferably have a three-layer structure including a Cu layer formed by baking a conductive paste, a Ni layer formed by plating, and a Sn layer formed by plating, for example.

Next, the conductors provided on the dielectric layers $1a$ to $1i$ of the multilayer body 1 will be described with reference to FIG. 3. The external terminals 2a to 2f are provided on the dielectric layers 1a to 1i, but assigning reference symbols to the drawing is omitted in some cases when it is unnecessary for explanation so as not to make the drawing difficult to see. In addition, the via conductors are provided in the dielectric layers 1d to 1h, penetrating between upper and lower main surfaces of the dielectric layers 1d to 1h. The same reference symbols are provided to the via conductors provided in different dielectric layers but connected to each other. Further, in order to connect the via conductors provided in different dielectric layers, relay electrodes are provided on the main surfaces of the dielectric layers in some cases, but the relay electrodes are not described and do not have reference symbols. In the following, unless otherwise specified, the description regarding a shape and arrangement of a capacitor conductor, the inductor conductor, and the like, for example, is the shape and arrangement when the multilayer body 1 is viewed in a perspective plan view from the stacking direction.

Capacitor conductors 4a, 4b, and 4c are provided on an upper main surface of the dielectric layer 1a. The capacitor conductor 4a is connected to the external terminal 2b defining the common external terminal. The capacitor conductor 4b is connected to the external terminal 2d defining the first external terminal. The capacitor conductor 4c is connected to the external terminal 2f defining the second external terminal.

A ground conductor 5 is provided on an upper main surface of the dielectric layer 1b. The ground conductor 5 is connected to the external terminals 2a, 2c, and 2e defining the ground external terminals.

A capacitor conductor 4d is provided on an upper main surface of the dielectric layer 1c.

A via conductor 6a penetrates between the upper and lower main surfaces of the dielectric layer 1d. Inductor conductors 7a and 7b are provided on an upper main surface of the dielectric layer 1d. A first end of the inductor conductor 7a is connected to the external terminal 2d defining the first external terminal. A first end of the inductor conductor 7b is connected to the external terminal 2f defining the second external terminal.

Via conductors 6a, 6b, and 6c penetrate between the upper and lower main surfaces of the dielectric layer 1e. Inductor conductors 7c, 7d, and 7e are provided on an upper main surface of the dielectric layer 1e. A first end of the inductor conductor 7c is connected to the external terminal 2b defining the common external terminal. A first end of the inductor conductor 7d is connected to the via conductor 6b, and the via conductor 6b is connected to a second end of the inductor conductor 7a. A first end of the inductor conductor 7e is connected to the via conductor 6c, and the via conductor 6c is connected to a second end of the inductor conductor 7b.

Via conductors 6a, 6d, 6e, and 6f penetrate between the upper and lower main surfaces of the dielectric layer 1f. Inductor conductors 7f, 7g, and 7h are provided on an upper main surface of the dielectric layer 1f. A first end of the inductor conductor 7f is connected to the via conductor 6d, and the via conductor 6d is connected to a second end of the inductor conductor 7c. A first end of the inductor conductor 7g is connected to the via conductor 6e, and the via conductor 6e is connected to a second end of the inductor conductor 7d. A first end of the inductor conductor 7h is connected to the via conductor 6f, and the via conductor 6f is connected to a second end of the inductor conductor 7e.

Via conductors 6a, 6j, 6k, and 6l penetrate between the upper and lower main surfaces of the dielectric layer 1g. Inductor conductors 7i, 7j, and 7k are provided on an upper main surface of the dielectric layer 1g. A first end of the inductor conductor 7i is connected to the via conductor 6j, and the via conductor 6j is connected to a second end of the inductor conductor 7f. A first end of the inductor conductor 7j is connected to the via conductor 6k, and the via conductor 6k is connected to a second end of the inductor conductor 7g. A first end of the inductor conductor 7k is connected to the via conductor 6l, and the via conductor 6l is connected to a second end of the inductor conductor 7h.

Via conductors 6a, 6j, 6k, and 6l penetrate between the upper and lower main surfaces of the dielectric layer 1h. An inductor conductor 7l and a connecting conductor 8 are provided on an upper main surface of the dielectric layer 1h. A first end of the inductor conductor 7l is connected to the via conductor 6k, and the via conductor 6k is connected to a second end of the inductor conductor 7i. A first end of the connecting conductor 8 is connected to the via conductor 6k, and the via conductor 6k is connected to a second end of the inductor conductor 7j. A second end of the connecting conductor 8 is connected to the via conductor 6l, and the via conductor 6l is connected to a second end of the inductor conductor 7k. A middle portion of the connecting conductor 8 is connected to the via conductor 6a, and the via conductor 6a is connected to the capacitor conductor 4d. A second end of the inductor conductor 7l is connected to the middle portion of the connecting conductor 8.

Materials of the capacitor conductors 4a to 4d, the ground conductor 5, the via conductors 6a to 6l, the inductor conductors 7a to 7l, and the connecting conductor 8 are not particularly limited, but Cu, for example, is preferably used in the present preferred embodiment.

The power distribution/coupling component 200 having the above structure can be manufactured by a conventional method of manufacturing the power distribution/coupling component 200.

Next, a relationship between the power distribution/coupling circuit 100 shown in FIG. 1 and the structure of the power distribution/coupling component 200 will be described. As described above, in the power distribution/coupling circuit 100 shown in FIG. 1, a portion surrounded by the broken line is defined by the power distribution/coupling component 200.

As shown in FIG. 1, the power distribution/coupling component 200 includes the external terminal 2b defining the common external terminal, the external terminal 2d defining the first external terminal, and the external terminal 2f defining the second external terminal.

The fourth capacitor C4 shown in FIG. 1 is defined by capacitance generated between the capacitor conductor 4a and the ground conductor 5 shown in FIG. 3.

The third inductor L3 shown in FIG. 1 is defined by a conductive path connecting the external terminal 2b, the inductor conductor 7c, the via conductor 6d, the inductor conductor 7f, the via conductor 6g, the inductor conductor 7i, the via conductor 6j, the inductor conductor 7l, and the connecting conductor 8 shown in FIG. 3. The external terminal 2b as a starting point is the common external terminal, and the connecting conductor 8 as an ending point corresponds to the first connection point P1 shown in FIG. 1. The inductor conductors 7c, 7f, 7i, and 7l correspond to third inductor conductors.

The first inductor L1 shown in FIG. 1 is defined by a conductive path connecting the connecting conductor 8, the via conductor 6k, the inductor conductor 7j, the via conductor 6h, the inductor conductor 7g, the via conductor 6e, the inductor conductor 7d, the via conductor 6b, the inductor conductor 7*a*, and the external terminal 2*d* shown in FIG. 3. The connecting conductor 8 as a starting point corresponds to the first connection point P1, and the external terminal 2*d* as an ending point is the first external terminal. The inductor conductors 7*j*, 7*g*, 7*d*, and 7*a* correspond to first inductor conductors.

The first capacitor C1 shown in FIG. 1 is defined by capacitance generated between the capacitor conductor 4*b* and the ground conductor 5 shown in FIG. 3.

The second inductor L2 shown in FIG. 1 is defined by a conductive path connecting the connecting conductor 8, the via conductor 6*l*, the inductor conductor 7*k*, the via conductor 6*i*, the inductor conductor 7*h*, the via conductor 6*f*, the inductor conductor 7*e*, the via conductor 6*c*, the inductor conductor 7*b*, and the external terminals 2*f* shown in FIG. 3. The connecting conductor 8 as a starting point corresponds to the first connection point P1, and the external terminal 2*f* as an ending point is the second external terminal. The inductor conductors 7*k*, 7*h*, 7*e*, and 7*b* correspond to second inductor conductors.

The second capacitor C2 shown in FIG. 1 is defined by capacitance generated between the capacitor conductor 4*c* and the ground conductor 5 shown in FIG. 3.

The third capacitor C3 shown in FIG. 1 is defined by capacitance generated between the capacitor conductor 4*d* and the ground conductor 5 shown in FIG. 3.

As shown in FIG. 1, the external terminal 2*b* of the power distribution/coupling component 200 is connected to the common terminal TC, the external terminal 2*d* is connected to the first terminal T1, and the external terminal 2*f* is connected to the second terminal T2. Although not shown, the external terminals 2*a*, 2*c*, and 2*e* of the power distribution/coupling component 200 are connected to the ground outside of the power distribution/coupling component 200. Further, the resistor R1 is connected between the first terminal T1 and the second terminal T2. The resistor R1 is provided as a component separate from the power distribution/coupling component 200, and is connected between the first terminal T1 and the second terminal T2. The resistor R1 as a separate component is preferably, for example, a discrete component. As described above, the power distribution/coupling circuit 100 is defined by the power distribution/coupling component 200 and the resistor R1.

FIG. 4 is a perspective view showing the via conductors 6*a* to 6*l*, the inductor conductors 7*a* to 7*l*, and the connecting conductor 8, with the inside of the multilayer body 1 of the power distribution/coupling component 200 viewed in a perspective plan view from the stacking direction of the dielectric layers 1*a* to 1*i*.

As described above, the first inductor L1 is defined by a conductive path connecting the connecting conductor 8, the via conductor 6*k*, the inductor conductor 7*j*, the via conductor 6*h*, the inductor conductor 7*g*, the via conductor 6*e*, the inductor conductor 7*d*, the via conductor 6*b*, the inductor conductor 7*a*, and the external terminal 2*d*. The first inductor L1 includes a winding axis in the stacking direction of the dielectric layers 1*a* to 1*i*, and includes an air core portion including the winding axis.

Further, as described above, the second inductor L2 is defined by a conductive path connecting the connecting conductor 8, the via conductor 6*l*, the inductor conductor 7*k*, the via conductor 6*i*, the inductor conductor 7*h*, the via conductor 6*f*, the inductor conductor 7*e*, the via conductor 6*c*, the inductor conductor 7*b*, and the external terminal 2*f*. The second inductor L2 includes a winding axis in the stacking direction of the dielectric layers 1*a* to 1*i*, and includes an air core portion including the winding axis. The air core portion is a region surrounded by the inductor conductor having a helical shape, indicating a region in which the inductor conductors are not provided.

Further, as described above, the third inductor L3 is defined by a conductive path connecting the external terminal 2*b*, the inductor conductor 7*c*, the via conductor 6*d*, the inductor conductor 7*f*, the via conductor 6*g*, the inductor conductor 7*i*, the via conductor 6*j*, the inductor conductor 7*l*, and the connecting conductor 8. The third inductor L3 includes a winding axis in the stacking direction of the dielectric layers 1*a* to 1*i*, and includes an air core portion including the winding axis.

In the power distribution/coupling component 200, the air core portion of the first inductor L1 (a region surrounded by the inductor conductors 7*j*, 7*g*, 7*d*, and 7*a* as the first inductor conductors, in which the inductor conductors are not provided as viewed in a perspective plan view from the stacking direction) does not overlap with the connecting conductor 8. Similarly, the air core portion of the second inductor L2 (a region surrounded by the inductor conductors 7*k*, 7*h*, 7*e*, and 7*b* as the second inductor conductors, in which the inductor conductors are not provided as viewed in a perspective plan view from the stacking direction) does not overlap with the connecting conductor 8. When the air core portions of the first inductor L1 and the second inductor L2 overlap with the connecting conductor 8, a magnetic flux of the first inductor L1 and the second inductor is hindered from being generated. However, in the power distribution/coupling component 200, the air core portions of the first inductor L1 and the second inductor do not overlap with the connecting conductor 8. Thus, the first inductor L1 and the second inductor L2 can provide a magnetic flux satisfactorily without being hindered by the connecting conductor 8. For this reason, the first inductor L1 and the second inductor L2 of the power distribution/coupling component 200 have a good Q value.

Further, in the power distribution/coupling component 200, a winding direction of the third inductor L3 and a winding direction of the first inductor L1 are the same, and an electric current flows smoothly from the third inductor L3 to the first inductor L1. On the other hand, a winding direction of the third inductor L3 and a winding direction of the second inductor L2 are different from one another. However, a winding direction at the inductor conductor 7*l* and the connecting conductor 8 is designed to change in an S shape, and thus the electric current flows smoothly from the third inductor L3 to the second inductor L2. For this reason as well, the first inductor L1, the second inductor L2, and the third inductor L3 of the power distribution/coupling component 200 have a good Q value. To change the winding direction in an S shape means to change the winding direction by turning left in a round path, then turning right in a round path, or turning right in a round path, and then turning left in a round path.

Example 1

In Example 1, the power distribution/coupling component 200 having the structure shown in FIGS. 2, 3, and 4 was manufactured, and the power distribution/coupling component 200 and the resistor R1 were used to manufacture the power distribution/coupling circuit 100 shown in FIG. 1. Table 1 shows an inductance value of the inductors, a capacitance value of the capacitors, and a resistance value of the resistor. The inductance value of the first inductor L1 and the inductance value of the second inductor L2 are set to the same or substantially the same value, and the capacitance value of the first capacitor C1 and the capacitance value of the second capacitor C2 are set to the same or substantially the same value.

TABLE 1

| L1<br>L2 | L3 | C1<br>C2 | C3 | C4 | R1 |
|---|---|---|---|---|---|
| 15.5 nH | 4.0 nH | 5.3 pF | 7.0 pF | 3.5 pF | 100 Ω |

Further, for comparison, a power distribution/coupling circuit in Comparative Example 1 was manufactured. In the comparative example, the third inductor L3 and the fourth capacitor C4 are removed from Example 1.

Figure 5:
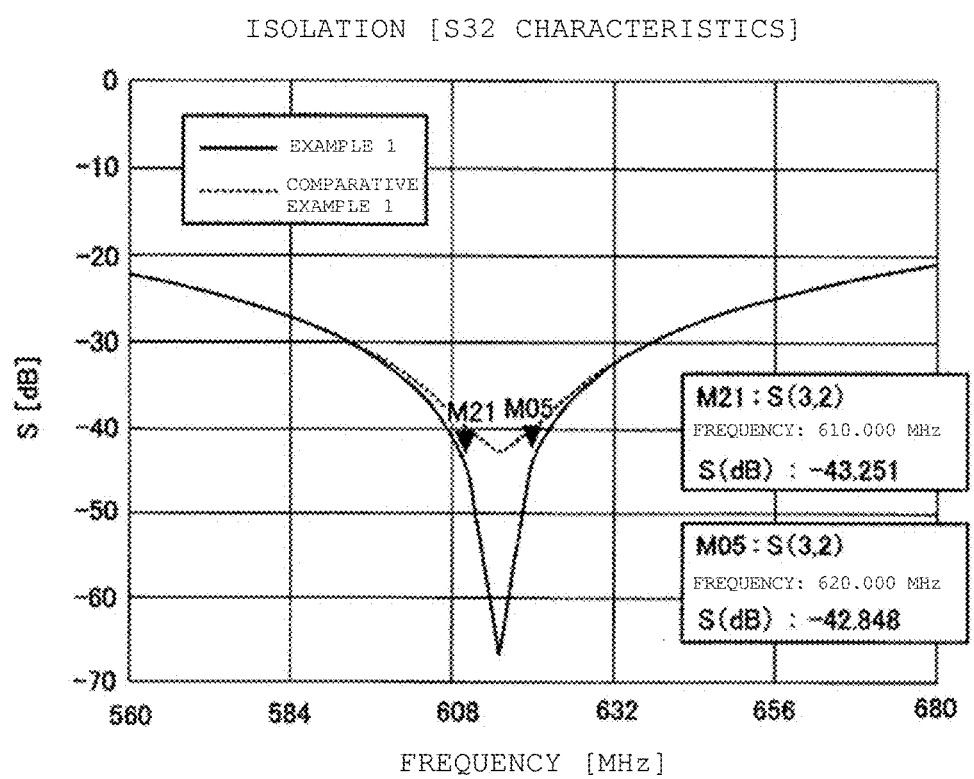
FIG. 5 is a graph showing S32 characteristics of Example 1 of a preferred embodiment of the present invention.

In FIG. 5, S32 characteristics of the power distribution/coupling circuit in Example 1 are shown by a solid line, and S32 characteristics of the power distribution/coupling circuit in Comparative Example 1 are shown by a broken line. However, the common terminal TC to which the external terminal 2b of the power distribution/coupling component 200 is connected is the first terminal, the first terminal T1 to which the external terminal 2d is connected is the second terminal, and the second terminal T2 to which the external terminal 2f is connected is a third terminal. The S32 characteristics indicate the isolation between the second terminal (first terminal T1) and the third terminal (second terminal T2).

As can be seen from FIG. 5, the power distribution/coupling circuit in Example 1 has a wider band in which a large attenuation is obtained as compared to the power distribution/coupling circuit in Comparative Example 1. Further, the power distribution/coupling circuit in Example 1 has a larger attenuation than the power distribution/coupling circuit in Comparative Example 1.

It is confirmed from the above that the power distribution/coupling circuit in Example 1 to which the third inductor L3 and the fourth capacitor C4 are included has better isolation between the first terminal T1 and the second terminal T2 than the power distribution/coupling circuit in Comparative Example 1.

Second Preferred Embodiment

Power Distribution/Coupling Circuit 300

Figure 6:
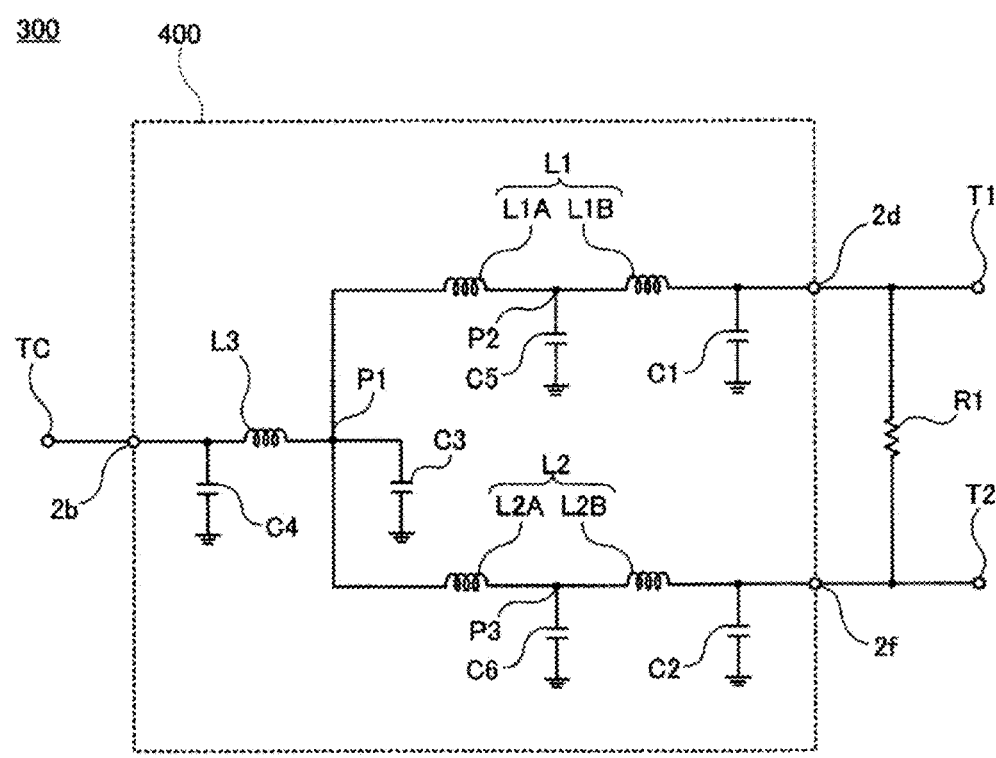
FIG. 6 is an equivalent circuit diagram of a power distribution/coupling circuit 300 according to a second preferred embodiment of the present invention.

FIG. 6 shows an equivalent circuit diagram of a power distribution/coupling circuit 300 according to a second preferred embodiment of the present invention. In FIG. 6, a portion of the circuit is surrounded by a broken line, and as will be described below, this portion is defined by a power distribution/coupling component 400 in the present preferred embodiment.

The power distribution/coupling circuit 300 according to the second preferred embodiment is configured by modifying a portion of the configuration of the power distribution/coupling circuit 100 according to the first preferred embodiment. Specifically, in the power distribution/coupling circuit 300, the first inductor L1 of the power distribution/coupling circuit 100 is divided into two inductors L1A and L1B at a second connection point P2. Similarly, in the power distribution/coupling circuit 300, the second inductor L2 of the power distribution/coupling circuit 100 is divided into two inductors L2A and L2B at a third connection point P3. The inductors L1A, L1B, L2A, and L2B are referred to as divided inductors in some cases. The divided inductor referred to here refers to each of the individual inductors among the plurality of inductors of the first inductor L1 or the second inductor L2.

Then, in the power distribution/coupling circuit 300, a fifth capacitor L5 is shunt-connected between the second connection point P2 and the ground. Further, in the power distribution/coupling circuit 300, a sixth capacitor L6 is shunt-connected between the third connection point P3 and the ground.

The remaining configuration of the power distribution/coupling circuit 300 is the same or substantially the same as that of the power distribution/coupling circuit 100.

Power Distribution/Coupling Component 400

As described above, in the present preferred embodiment, a portion of the circuit of the power distribution/coupling circuit 300 (the portion surrounded by the broken line in FIG. 6) is defined by the power distribution/coupling component 400.

Figure 7:
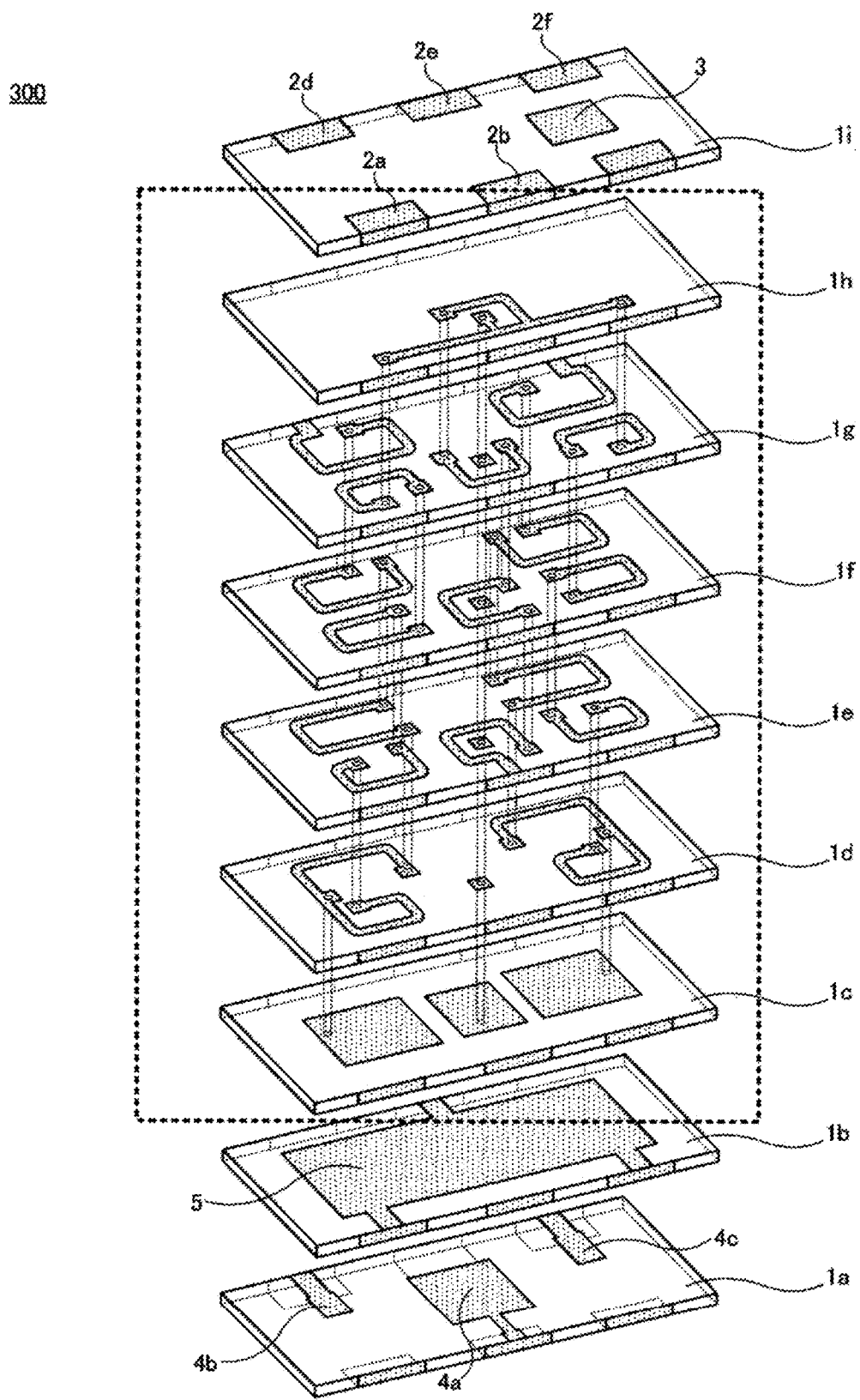
FIG. 7 is an exploded perspective view of a power distribution/coupling component 400 according to the second preferred embodiment of the present invention.
Figure 8:
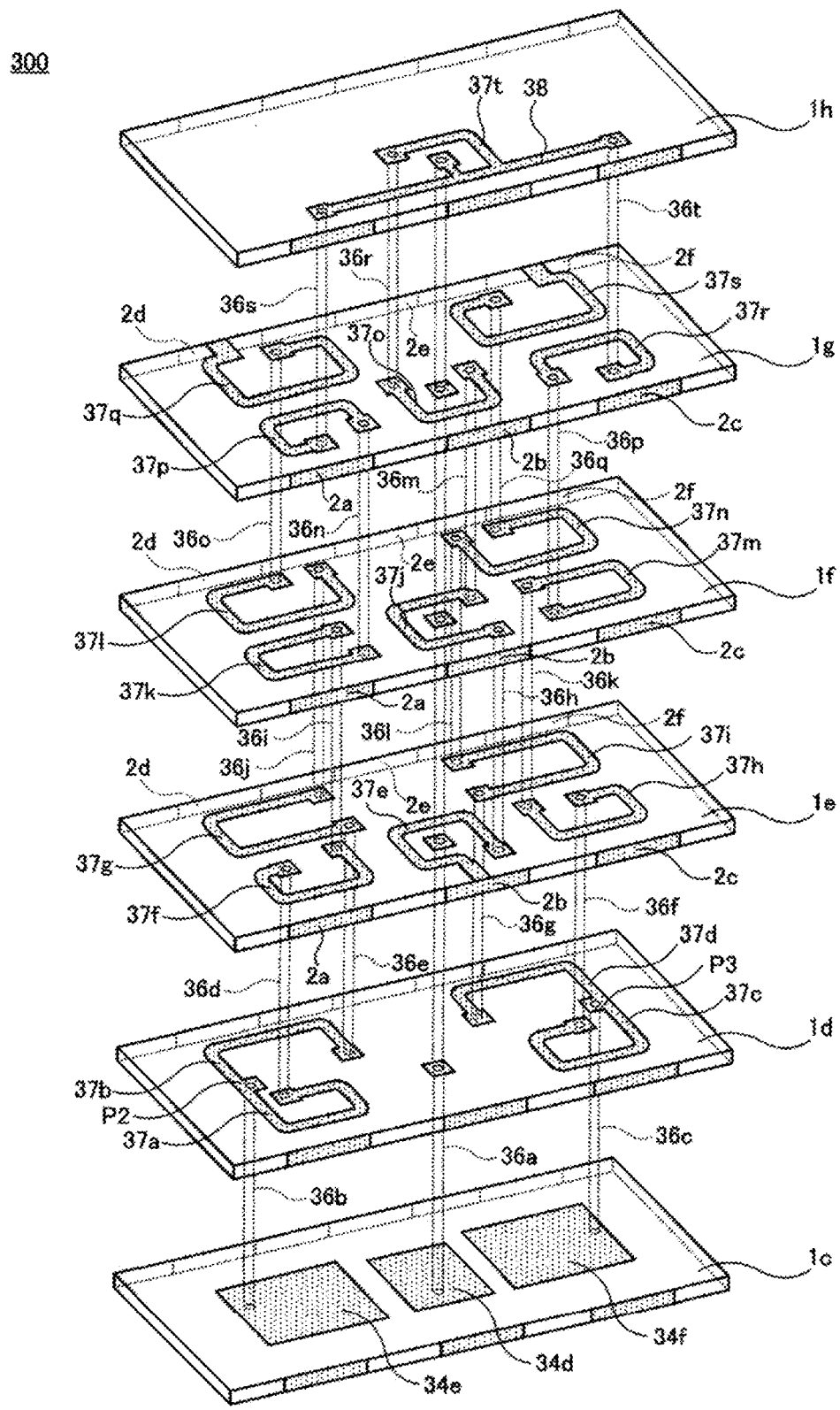
FIG. 8 is an exploded perspective view of a main portion of the power distribution/coupling component 400.

FIGS. 7 and 8 show the power distribution/coupling component 400. FIG. 7 is an exploded perspective view of the power distribution/coupling component 400. FIG. 8 is an exploded perspective view of a main portion of the power distribution/coupling component 400.

The power distribution/coupling component 400 according to the second preferred embodiment is configured by modifying a portion of the configuration of the power distribution/coupling component 200 according to the first preferred embodiment.

Specifically, of the dielectric layers 1c to 1h surrounded by the broken line in FIG. 7, the number, shape, formation position, and connection relationship of the capacitor conductors, the via conductors, and the inductor conductors in the dielectric layers 1c to 1g are changed from the power distribution/coupling component 200. The dielectric layers 1a, 1b, 1h, and 1i are unchanged from the power distribution/coupling component 200.

FIG. 8 is an enlarged view of the dielectric layers 1c to 1h surrounded by the broken line in FIG. 7. The capacitor conductors, via conductors, inductor conductors and the like, for example, provided in the dielectric layers 1c to 1h will be described below.

Capacitor conductors 34d, 34e, and 34f are provided on the upper main surface of the dielectric layer 1c.

Via conductors 36a, 36b, and 36c penetrate between the upper and lower main surfaces of the dielectric layer 1d. Inductor conductors 37a, 37b, 37c, and 37d are provided on the upper main surface of the dielectric layer 1d. A first end of the inductor conductor 37a and a first end of the inductor conductor 37b are connected at the second connection point P2. The second connection point P2 is connected to the via conductor 36b, and the via conductor 36b is connected to the capacitor conductor 34e. Further, a first end of the inductor conductor 37c and a first end of the inductor conductor 37d are connected at the third connection point P3. The third connection point P3 is connected to the via conductor 36c, and the via conductor 36c is connected to the capacitor conductor 34f.

Via conductors 36a, 36d, 36e, 36f, and 36g penetrate between the upper and lower main surfaces of the dielectric layer 1e. Inductor conductors 37e, 37f, 37g, 37h, and 37i are provided on the upper main surface of the dielectric layer 1e. A first end of the inductor conductor 37e is connected to the external terminal 2b as the common external terminal. A first end of the inductor conductor 37f is connected to the via conductor 36d, and the via conductor 36d is connected to a second end of the inductor conductor 37a. A first end of the inductor conductor 37g is connected to the via conductor 36e, and the via conductor 36e is connected to a second end of the inductor conductor 37b. A first end of the inductor conductor 37h is connected to the via conductor 36f, and the via conductor 36f is connected to a second end of the inductor conductor 37c. A first end of the inductor conductor 37i is connected to the via conductor 36g, and the via conductor 36g is connected to a second end of the inductor conductor 37d.

Via conductors 36a, 36h, 36i, 36j, 36k, and 36l penetrate between the upper and lower main surfaces of the dielectric layer 1f. Inductor conductors 37j, 37k, 37l, 37m, and 37n are provided on the upper main surface of the dielectric layer 1f. A first end of the inductor conductor 37j is connected to the via conductor 36h, and the via conductor 36h is connected to a second end of the inductor conductor 37e. A first end of the inductor conductor 37k is connected to the via conductor 36i, and the via conductor 36i is connected to a second end of the inductor conductor 37f. A first end of the inductor conductor 37l is connected to the via conductor 36j, and the via conductor 36j is connected to a second end of the inductor conductor 37g. A first end of the inductor conductor 37m is connected to the via conductor 36k, and the via conductor 36k is connected to a second end of the inductor conductor 37h. A first end of the inductor conductor 37n is connected to the via conductor 36l, and the via conductor 36l is connected to a second end of the inductor conductor 37i.

Via conductors 36a, 36m, 36n, 36o, 36p, and 36q penetrate between the upper and lower main surfaces of the dielectric layer 1g. Inductor conductors 37o, 37p, 37q, 37r, and 37s are provided on the upper main surface of the dielectric layer 1g. A first end of the inductor conductor 37o is connected to the via conductor 36m, and the via conductor 36m is connected to a second end of the inductor conductor 37j. A first end of the inductor conductor 37p is connected to the via conductor 36n, and the via conductor 36n is connected to a second end of the inductor conductor 37k. A first end of the inductor conductor 37q is connected to the via conductor 36o, and the via conductor 36o is connected to a second end of the inductor conductor 37l. A first end of the inductor conductor 37r is connected to the via conductor 36p, and the via conductor 36p is connected to a second end of the inductor conductor 37m. A first end of the inductor conductor 37s is connected to the via conductor 36q, and the via conductor 36q is connected to a second end of the inductor conductor 37n. A second end of the inductor conductor 37q is connected to the external terminal 2d as the first external terminal. A second end of the inductor conductor 37s is connected to the external terminal 2f as the second external terminal.

Via conductors 36a, 36r, 36s, and 36t penetrate between the upper and lower main surfaces of the dielectric layer 1h. An inductor conductor 37t and a connecting conductor 38 are provided on the upper main surface of the dielectric layer 1h. A first end of the inductor conductor 37t is connected to the via conductor 36r, and the via conductor 36r is connected to a second end of the inductor conductor 37o. A first end of the connecting conductor 38 is connected to the via conductor 36s, and the via conductor 36s is connected to a second end of the inductor conductor 37p. A second end of the connecting conductor 38 is connected to the via conductor 36t, and the via conductor 36t is connected to a second end of the inductor conductor 37r. A middle portion of the connecting conductor 38 is connected to the via conductor 36a, and the via conductor 36a is connected to the capacitor conductor 34d. A second end of the inductor conductor 37t is connected to the middle portion of the connecting conductor 38.

Next, a relationship between the power distribution/coupling circuit 300 shown in FIG. 6 and the structure of the power distribution/coupling component 400 will be described. As described above, in the power distribution/coupling circuit 300 shown in FIG. 6, the portion surrounded by the broken line is defined by the power distribution/coupling component 400. In the following, the description of the portions of the power distribution/coupling component 400 that have not been changed from the power distribution/coupling component 200 according to the first preferred embodiment are omitted in some cases.

The third inductor L3 shown in FIG. 6 is defined by a conductive path connecting the external terminal 2b, the inductor conductor 37e, the via conductor 36h, the inductor conductor 37j, the via conductor 36m, the inductor conductor 37o, the via conductor 36r, the inductor conductor 37t, the connecting conductor 38 shown in FIG. 8. The external terminal 2b as a starting point is the common external terminal, and the connecting conductor 38 as an ending point corresponds to the first connection point P1 shown in FIG. 6.

The third capacitor C3 shown in FIG. 6 is defined by capacitance generated between the capacitor conductor 34d and the ground conductor 5 shown in FIGS. 7 and 8. The capacitor conductor 34d is connected to the connecting conductor 38 as the first connection point P1, by the via conductor 36a. The ground conductor 5 is connected to the external terminals 2a, 2c, and 2e as the ground external terminals.

The inductor L1A in which the first inductor L1 shown in FIG. 6 is divided is defined by a conductive path connecting the connecting conductor 38, the via conductor 36s, the inductor conductor 37p, the via conductor 36n, the inductor conductor 37k, the via conductor 36i, the inductor conductor 37f, the via conductor 36d, the inductor conductor 37a, and the second connection point P2 shown in FIG. 8. The connecting conductor 38 as a starting point corresponds to the first connection point P1, and an ending point is the second connection point P2.

The inductor L1B in which the first inductor L1 shown in FIG. 6 is divided is defined by a conductive path connecting the second connection point P2, the inductor conductor 37b, the via conductor 36e, the inductor conductor 37g, the via conductor 36j, the inductor conductor 37l, the via conductor 36o, the inductor conductor 37q, and the external terminal 2d shown in FIG. 8. A starting point is the second connection point P2, and the external terminal 2d as an ending point is the first external terminal.

The inductor L2A in which the second inductor L2 shown in FIG. 6 is divided is defined by a conductive path connecting the connecting conductor 38, the via conductor 36t, the inductor conductor 37r, the via conductor 36p, the inductor conductor 37m, the via conductor 36k, the inductor conductor 37h, the via conductor 36f, the inductor conductor 37c, and the third connection point P3 shown FIG. 8. The connecting conductor 38 as a starting point corresponds to the first connection point P1, and an ending point is the third connection point P3.

The inductor L2B in which the second inductor L2 shown in FIG. 6 is divided is defined by a conductive path connecting the third connection point P3, the inductor conductor 37d, the via conductor 36g, the inductor conductor 37i, the via conductor 36l, the inductor conductor 37n, the via conductor 36q, the inductor conductor 37s, and the external terminal 2f shown in FIG. 8. A starting point is the third connection point P3, and the external terminal 2f as an ending point is the second external terminal.

The fifth capacitor C5 shown in FIG. 6 is defined by capacitance generated between the capacitor conductor 34e and the ground conductor 5 shown in FIG. 8. The capacitor conductor 34e is connected to the second connection point P2 by the via conductor 36b, and the ground conductor 5 is connected to the external terminals 2a, 2c, and 2e as the ground external terminals.

The sixth capacitor C6 shown in FIG. 6 is defined by capacitance generated between the capacitor conductor 34f and the ground conductor 5 shown in FIG. 8. The capacitor conductor 34f is connected to the third connection point P3 by the via conductor 36c, and the ground conductor 5 is connected to the external terminals 2a, 2c, and 2e as the ground external terminals.

As shown in FIG. 6, the external terminal 2b of the power distribution/coupling component 400 is connected to the common terminal TC, the external terminal 2d is connected to the first terminal T1, and the external terminal 2f is connected to the second terminal T2. Further, the resistor R1 is connected between the first terminal T1 and the second terminal T2. As described above, the power distribution/coupling circuit 300 is configured by the power distribution/coupling component 400 and the resistor R1.

Example 2

In Example 2, the power distribution/coupling component 400 having the structure shown in FIGS. 7 and 8 was manufactured, and the power distribution/coupling component 400 and the resistor R1 were used to manufacture the power distribution/coupling circuit 300 shown in FIG. 6. Table 2 shows an inductance value of the inductors, a capacitance value of the capacitors, and a resistance value of the resistor.

TABLE 2

| L1A<br>L2A | L1B<br>L2B | L3 | C1<br>C2 | C3 | C4 | C5<br>C6 | R1 |
|---|---|---|---|---|---|---|---|
| 9.0 nH | 8.0 nH | 5.2 nH | 0.8 pF | 2.1 pF | 4.2 pF | 4.0 pF | 100 Ω |

Further, for comparison, a power distribution/coupling circuit in Comparative Example 2 was manufactured. In Comparative Example 2, the third inductor L3 and the fourth capacitor C4 are removed from Example 2.

Figure 9:
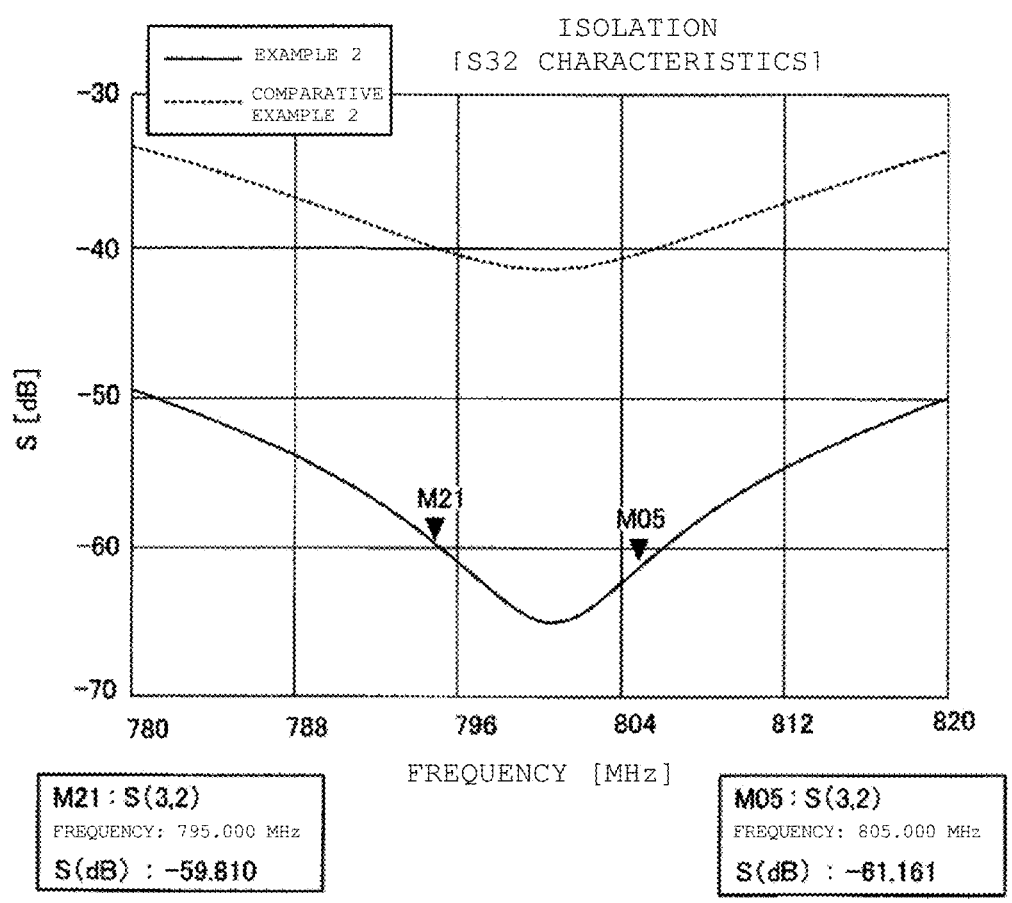
FIG. 9 is a graph showing the S32 characteristics of Example 2 of a preferred embodiment of the present invention.

In FIG. 9, S32 characteristics of the power distribution/coupling circuit in Example 2 are shown by a solid line, and S32 characteristics of the power distribution/coupling circuit in Comparative Example 2 are shown by a broken line. However, the common terminal TC to which the external terminal 2b of the power distribution/coupling component 400 is connected is the first terminal, the first terminal T1 to which the external terminal 2d is connected is the second terminal, and the second terminal T2 to which the external terminal 2f is connected is the third terminal.

As can be seen from FIG. 9, the power distribution/coupling circuit in Example 2 has a wider band in which a large attenuation is obtained as compared to the power distribution/coupling circuit in Comparative Example 2. Further, the power distribution/coupling circuit in Example 2 has a larger attenuation than the power distribution/coupling circuit in Comparative Example 2. Specifically, an attenuation amount of about 59.8 dB is obtained in Example 2, whereas an attenuation amount of about 40.0 dB is obtained in Comparative Example 2, thus resulting in an increase in the attenuation.

Example 3

In Example 3, similar to Example 2, the power distribution/coupling component 400 having the structure shown in FIGS. 7 and 8 was manufactured, and the power distribution/coupling component 400 and the resistor R1 were used to manufacture the power distribution/coupling circuit 300 shown in FIG. 6. Table 3 shows an inductance value of the inductors, a capacitance value of the capacitors, and a resistance value of the resistor.

TABLE 3

| L1A<br>L2A | L1B<br>L2B | L3 | C1<br>C2 | C3 | C4 | C5<br>C6 | R1 |
|---|---|---|---|---|---|---|---|
| 9.9 nH | 8.7 nH | 4.1 nH | 0.6 pF | 1.5 pF | 3.8 pF | 3.5 pF | 100 Ω |

Further, for comparison, a power distribution/coupling circuit in Comparative Example 3 was manufactured. In Comparative Example 3, the third inductor L3 and the fourth capacitor C4 are removed from Example 3.

Figure 10:
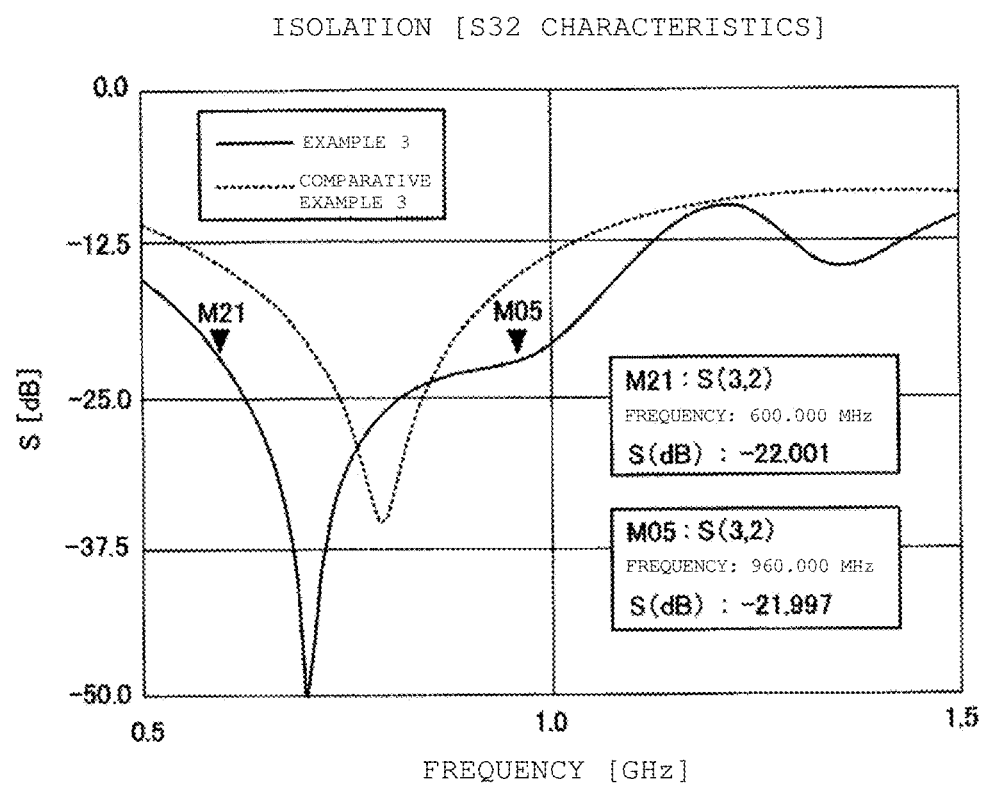
FIG. 10 is a graph showing the S32 characteristics of Example 3 of a preferred embodiment of the present invention.

In FIG. 10, S32 characteristics of the power distribution/coupling circuit in Example 3 are shown by a solid line, and S32 characteristics of the power distribution/coupling circuit in Comparative Example 3 are shown by a broken line. However, the common terminal TC to which the external terminal 2b of the power distribution/coupling component 400 is connected is the first terminal, the first terminal T1 to which the external terminal 2d is connected is the second terminal, and the second terminal T2 to which the external terminal 2f is connected is the third terminal.

As can be seen from FIG. 10, the power distribution/coupling circuit in Example 3 has a wider band in which a large attenuation is obtained as compared to the power distribution/coupling circuit in Comparative Example 3. Further, the power distribution/coupling circuit in Example 3 has a larger attenuation than the power distribution/coupling circuit in Comparative Example 3.

Third Preferred Embodiment

Power Distribution/Coupling Circuit 500

Figure 11:
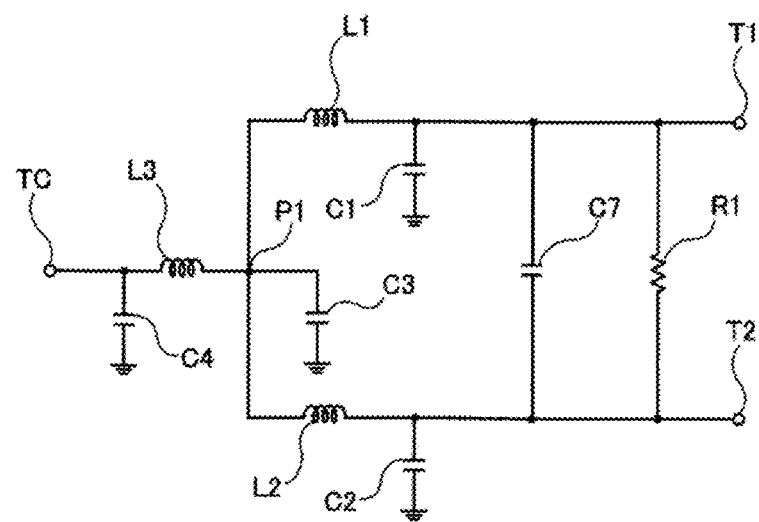
FIG. 11 is an equivalent circuit diagram of a power distribution/coupling circuit 500 according to a third preferred embodiment of the present invention.

FIG. 11 shows an equivalent circuit diagram of a power distribution/coupling circuit 500 according to a third preferred embodiment of the present invention.

In the power distribution/coupling circuit 500 according to the third preferred embodiment, an additional configuration is added to the power distribution/coupling circuit 100 according to the first preferred embodiment. Specifically, in the power distribution/coupling circuit 500, a seventh capacitor C7 is provided between the first terminal T1 and the second terminal T2. The seventh capacitor C7 is connected in parallel with the resistor R1 between the first terminal T1 and the second terminal T2.

In the power distribution/coupling circuit 500, due to the addition of the seventh capacitor C7, the S32 characteristics indicating the isolation between the first terminal T1 and the second terminal T2 shift toward a low frequency, although not shown in FIG. 11.

In the power distribution/coupling circuit, a frequency with good S11 characteristics indicating a return loss of the common terminal TC and a frequency with good S32 characteristics indicating the isolation between the first terminal T1 and the second terminal T2 are to be superimposed in some cases. In order to superimpose a frequency with good S11 characteristics and a frequency with good S32 characteristics, a method is effective in which the S11 characteristics and the S32 characteristics are superimposed by adding the seventh capacitor C7 as in the power distribution/coupling circuit 500 to shift the S32 characteristics toward a low frequency.

Fourth Preferred Embodiment

Power Distribution/Coupling Component 600

Figure 12:
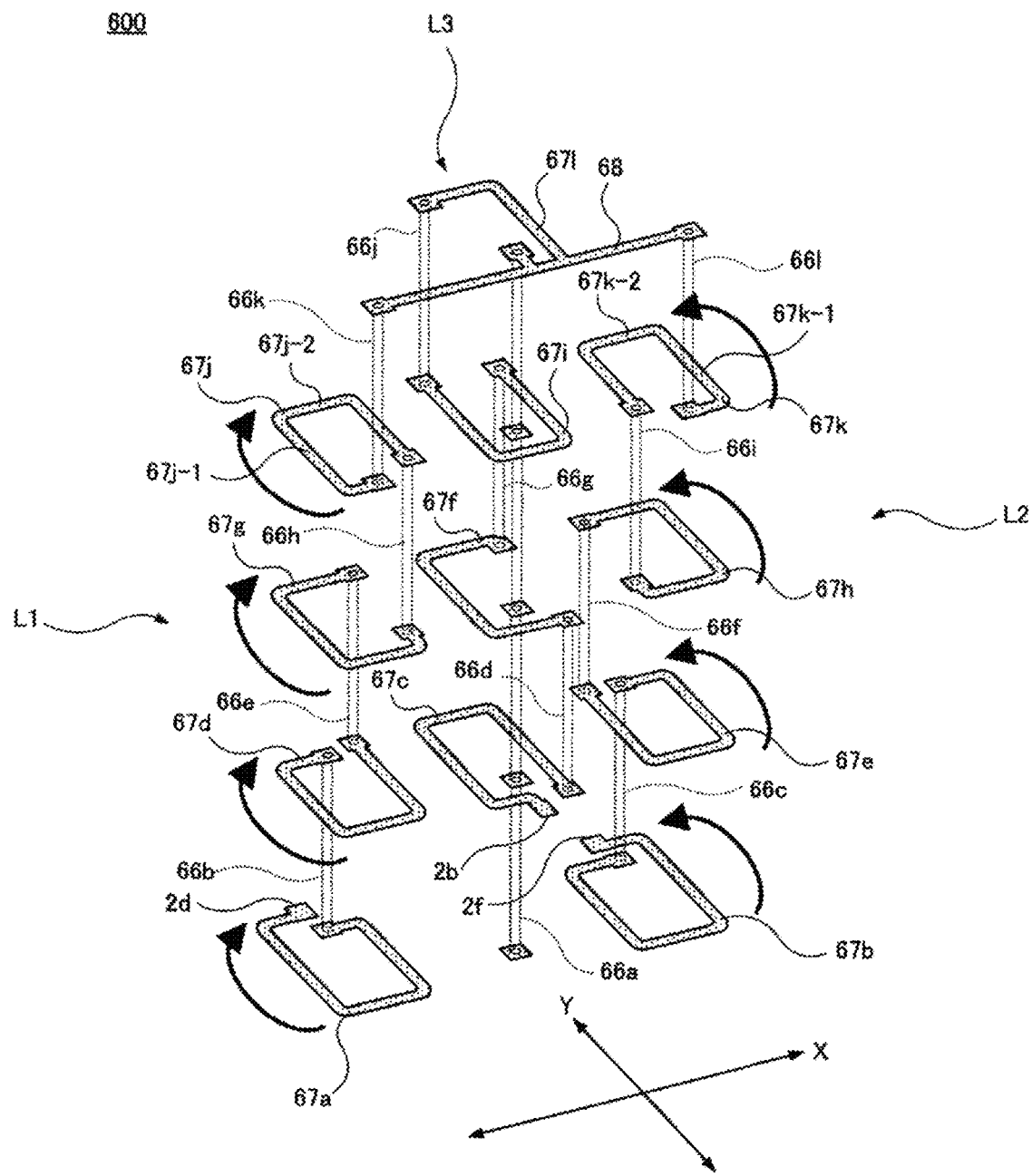
FIG. 12 is a perspective view of an exploded main portion of a power distribution/coupling component 600 according to a fourth preferred embodiment of the present invention.

FIG. 12 is a perspective view of an exploded main portion of a power distribution/coupling component 600 according to a fourth preferred embodiment of the present invention.

The power distribution/coupling component 600 according to the fourth preferred embodiment has the same or substantially the same basic configuration as the power distribution/coupling component 200 according to the first preferred embodiment shown in FIGS. 2, 3, and 4. Thus, the power distribution/coupling component 600 has the same winding directions of the first inductor conductors, the second inductor conductors, and the third inductor conductors as the power distribution/coupling component 200. However, the power distribution/coupling component 600 has different characteristics from the power distribution/coupling component 200 because the design has been changed such that the size of the air core portion of the third inductor conductor is increased.

As shown in FIG. 12, the first inductor L1 of the power distribution/coupling component 600 is defined by a conductive path connecting a connecting conductor 68, a via conductor 66k, an inductor conductor 67j, a via conductor 66h, an inductor conductor 67g, a via conductor 66e, an inductor conductor 67d, and a via conductor 66b, an inductor conductor 67a, and the external terminal 2d. The connecting conductor 68 corresponds to a first end (starting point) of the first inductor L1, and the external terminal 2d corresponds to a second end (ending point) of the first inductor L1.

The second inductor L2 of the power distribution/coupling component 600 is defined by a conductive path connecting the connecting conductor 68, the via conductor 66l, the inductor conductor 67k, the via conductor 66i, the inductor conductor 67h, the via conductor 66f, the inductor conductor 67e, the via conductor 66c, the inductor conductor 67b, and the external terminal 2f. The connecting conductor 68 corresponds to a first end (starting point) of the second inductor L2, and the external terminal 2f corresponds to a second end (ending point) of the second inductor L2.

The third inductor L3 of the power distribution/coupling component 600 is defined by a conductive path connecting the external terminal 2b, the inductor conductor 67c, the via conductor 66d, the inductor conductor 67f, the via conductor 66g, the inductor conductor 67i, the via conductor 66j, the inductor conductor 67l, and the connecting conductor 8. The external terminal 2b corresponds to a first end (starting point) of the third inductor L3, and the connecting conductor 68 corresponds to a second end (ending point) of the third inductor L3.

A direction in which the air core portion of the first inductor conductors (a region surrounded by the inductor conductors 67j, 67g, 67d, and 67a as the first inductor conductors, in which the inductor conductors are not provided as viewed in a perspective plan view from the stacking direction) and the air core portion of the second inductor conductors (a region surrounded by the inductor conductors 67k, 67h, 67e, and 67b as the second inductor conductors, in which the inductor conductor are not provided as viewed in a perspective plan view from the stacking direction) are arranged in parallel or substantially in parallel with each other is defined as an arrangement direction of the first inductor conductors and the second inductor conductors. In FIG. 12, the arrangement direction of the first inductor conductors and the second inductor conductors is indicated by an arrow X. Further, a direction in which the first inductor conductors and the second inductor conductors intersect the arrangement direction X at a right angle is indicated by an arrow Y.

At least a portion of the air core portion of the third inductor conductors is sandwiched between the air core portion of the first inductor conductors and the air core portion of the second inductor conductors in the arrangement direction X of the first inductor conductors and the second inductor conductors.

In FIG. 12, the winding directions of the first inductor conductors and the second inductor conductors of the power distribution/coupling component 600 are indicated by arrows.

In the power distribution/coupling component 600, when the multilayer body 1 is viewed in a perspective plan view from the stacking direction, the winding direction from a first end (connecting conductor 68) to a second end (external terminal 2d) of the first inductor conductors is different from the winding direction from a first end (connecting conductor 68) to a second end (external terminal 2f) of the second inductor conductors. That is, the winding direction of the first inductor conductors is clockwise, and the winding direction of the second inductor conductors is counterclockwise, for example.

Further, in the power distribution/coupling component 600, when the multilayer body 1 is viewed in a perspective plan view from the stacking direction, the winding direction of an outermost first portion of the first inductor conductors and the winding direction of an outermost first portion of the second inductor conductors are in the same direction in the arrangement direction X of the first inductor conductors and the second inductor conductors. For example, in view of the inductor conductor 67j as the first inductor conductor and the inductor conductor 67k as the second inductor conductor, the winding direction of an outermost first portion 67j-1 of the inductor conductor 67j and the winding direction of an outermost first portion 67k-1 of the inductor conductor 67k are the same direction in the arrangement direction X of the first inductor conductors and the second inductor conductors. Winding configurations are all similar at not only the inductor conductor 67j and the inductor conductor 67k but also the inductor conductors 67j, 67g, 67d, and 67a as the first inductor conductors and the inductor conductors 67k, 67h, 67e, and 67b as the second inductor conductors.

Further, in the power distribution/coupling component 600, when the multilayer body 1 is viewed in a perspective plan view from the stacking direction, in the direction Y intersecting the arrangement direction X of the first inductor conductors and the second inductor conductors at a right angle, a winding direction of a second portion of the first inductor conductors opposite to the first end (connecting conductor 68) of the first inductor conductors with the air core portion interposed therebetween and a winding direction of a second portion of the second inductor conductors opposite to the first end (connecting conductor 68) of the second inductor conductors with the air core portion interposed therebetween are inwardly opposing directions in the arrangement direction X of the first inductor conductors and the second inductor conductors. In view of the inductor conductor 67*j* as the first inductor conductor and the inductor conductor 67*k* as the second inductor conductor, in the direction Y intersecting the arrangement direction X of the first inductor conductors and the second inductor conductors at a right angle, a winding direction of a second portion 67*j*-2 of the inductor conductor 67*j* opposite to the first end (connecting conductor 68) of the first inductor conductors with the air core portion interposed therebetween and a winding direction of a second portion 67*k*-2 of the inductor conductor 67*k* opposite to the first end (connecting conductor 68) of the second inductor conductors with the air core portion interposed therebetween are inwardly opposing directions in the arrangement direction X of the first inductor conductors and the second inductor conductors. Winding configurations are all similar at not only the inductor conductor 67*j* and the inductor conductor 67*k* but also the inductor conductors 67*j*, 67*g*, 67*d*, and 67*a* as the first inductor conductors and the inductor conductors 67*k*, 67*h*, 67*e*, and 67*b* as the second inductor conductors.

A return loss is smaller in a wide band in the power distribution/coupling component 600 according to the fourth preferred embodiment, in which the winding direction of the first inductor conductors and the second inductor conductors have the above-described relationship. However, details of the characteristics of the power distribution/coupling component 600 will be described later together with the characteristics of the power distribution/coupling component 700 according to the fifth preferred embodiment described below.

Fifth Preferred Embodiment

Power Distribution/Coupling Component 700

Figure 13:
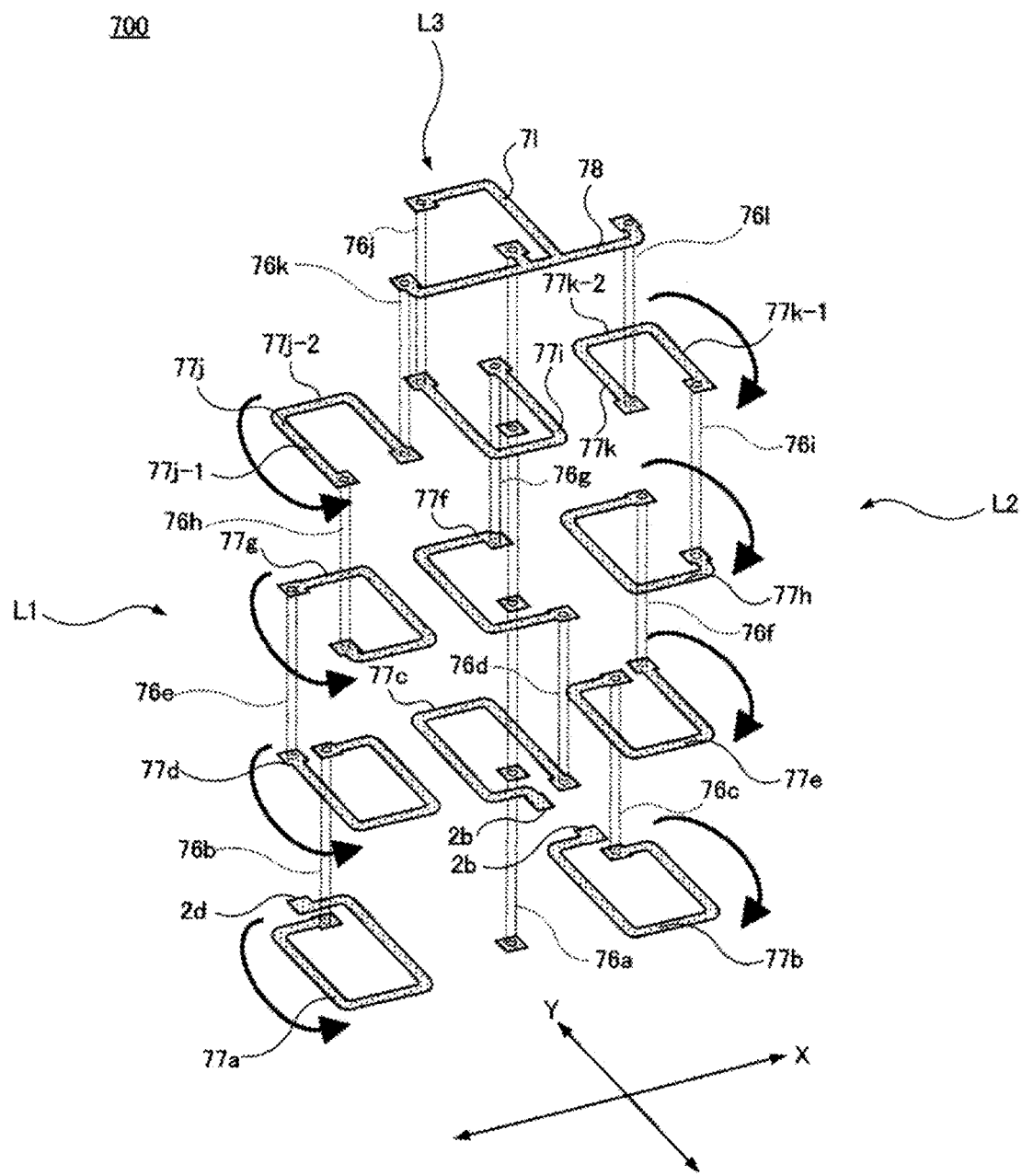
FIG. 13 is a perspective view of an exploded main portion of a power distribution/coupling component 700 according to a fifth preferred embodiment of the present invention.

FIG. 13 is a perspective view of an exploded main portion of a power distribution/coupling component 700 according to a fifth preferred embodiment of the present invention.

The power distribution/coupling component 700 according to the fifth preferred embodiment is configured by modifying a portion of the configuration of the power distribution/coupling component 600 according to the fourth preferred embodiment. Specifically, the winding direction of the first inductor conductors and the winding direction of the second inductor conductors are changed by changing the shape of the inductor conductors and the position of the via conductors. The remaining configuration of the power distribution/coupling component 700 is the same or substantially the same as that of the power distribution/coupling component 600.

As shown in FIG. 13, the first inductor L1 of the power distribution/coupling component 700 is defined by a conductive path connecting a connecting conductor 78, a via conductor 76*k*, an inductor conductor 77*j*, a via conductor 76*h*, an inductor conductor 77*g*, a via conductor 76*e*, an inductor conductor 77*d*, a via conductor 76*b*, an inductor conductor 77*a*, and the external terminal 2*d*. The connecting conductor 78 corresponds to the first end (starting point) of the first inductor L1, and the external terminal 2*d* corresponds to the second end (ending point) of the first inductor L1.

The second inductor L2 of the power distribution/coupling component 700 is defined by a conductive path connecting the connecting conductor 78, the via conductor 76*l*, the inductor conductor 77*k*, the via conductor 76*i*, the inductor conductor 77*h*, the via conductor 76*f*, the inductor conductor 77*e*, the via conductor 76*c*, the inductor conductor 77*b*, and the external terminal 2*f*. The connecting conductor 78 corresponds to the first end (starting point) of the second inductor L2, and the external terminal 2*f* corresponds to the second end (ending point) of the second inductor L2.

The third inductor L3 of the power distribution/coupling component 700 is defined by a conductive path connecting the external terminal 2*b*, the inductor conductor 77*c*, the via conductor 76*d*, the inductor conductor 77*f*, the via conductor 76*g*, the inductor conductor 77*i*, the via conductor 76*j*, the inductor conductor 77*l*, and the connecting conductor 8. The external terminal 2*b* corresponds to the first end (starting point) of the third inductor L3, and the connecting conductor 78 corresponds to the second end (ending point) of the third inductor L3.

FIG. 13 shows the arrangement direction X in which the air core portion of the first inductor conductors and the air core portion of the second inductor conductors are arranged and the direction Y intersecting the arrangement direction X at a right angle.

Further, FIG. 13 shows the winding directions of the first inductor conductors and the second inductor conductors of the power distribution/coupling component 700 with arrows.

In the power distribution/coupling component 700, when the multilayer body 1 is viewed in a perspective plan view from the stacking direction, the winding direction from the first end (connecting conductor 78) to the second end (external terminal 2*d*) of the first inductor conductors is different from the winding direction from the first end (connecting conductor 78) to the second end (external terminal 2*f*) of the second inductor conductors. That is, the winding direction of the first inductor conductors is counterclockwise, and the winding direction of the second inductor conductors is clockwise, for example.

Further, in the power distribution/coupling component 700, when the multilayer body 1 is viewed in a perspective plan view from the stacking direction, the winding direction of an outermost first portion of the first inductor conductors and the winding direction of an outermost first portion of the second inductor conductors are the same direction in the arrangement direction X of the first inductor conductors and the second inductor conductors. For example, in view of the inductor conductor 77*j* as the first inductor conductor and the inductor conductor 77*k* as the second inductor conductor, the winding direction of an outermost first portion 77*j*-1 of the inductor conductor 77*j* and the winding direction of an outermost first portion 77*k*-1 of the inductor conductor 77*k* are the same direction in the arrangement direction X of the first inductor conductors and the second inductor conductors. Winding configurations are all similar at not only the inductor conductor 77*j* and the inductor conductor 77*k* but also the inductor conductors 77*j*, 77*g*, 77*d*, and 77*a* as the first inductor conductors and the inductor conductors 77*k*, 77*h*, 77*e*, and 77*b* as the second inductor conductors.

Further, in the power distribution/coupling component 700, when the multilayer body 1 is viewed in a perspective plan view from the stacking direction, in the direction Y intersecting the arrangement direction X of the first inductor conductors and the second inductor conductors at a right angle, a winding direction of a second portion of the first inductor conductors opposite to the first end (connecting conductor 78) of the first inductor conductors with the air core portion interposed therebetween and a winding direction of a second portion of the second inductor conductors opposite to the first end (connecting conductor 78) of the second inductor conductors with the air core portion interposed therebetween are outwardly opposing directions in the arrangement direction X of the first inductor conductors and the second inductor conductors. In view of the inductor conductor 77*j* as the first inductor conductor and the inductor conductor 77*k* as the second inductor conductor, in the direction Y intersecting the arrangement direction X of the first inductor conductors and the second inductor conductors at a right angle, a winding direction of a second portion 77*j*-2 of the inductor conductor 77*j* opposite to the first end (connecting conductor 78) of the first inductor conductors with the air core portion interposed therebetween and a winding direction of a second portion 77*k*-2 of the inductor conductor 77*k* opposite to the first end (connecting conductor 78) of the second inductor conductors with the air core portion interposed therebetween are outwardly opposing directions in the arrangement direction X of the first inductor conductors and the second inductor conductors. Winding manners are all similar at not only the inductor conductor 77*j* and the inductor conductor 77*k* but also the inductor conductors 77*j*, 77*g*, 77*d*, and 77*a* as the first inductor conductors and the inductor conductors 77*k*, 77*h*, 77*e*, and 77*b* as the second inductor conductors.

The characteristics of the power distribution/coupling component 700 will be described below together with the characteristics of the power distribution/coupling component 600 according to the fourth preferred embodiment.

The power distribution/coupling component 600 and the resistor R1 according to the fourth preferred embodiment were used to manufacture the same power distribution/coupling circuit as the power distribution/coupling circuit 100 shown in FIG. 1. Further, the power distribution/coupling component 700 and the resistor R1 according to the fifth preferred embodiment were used to manufacture the same power distribution/coupling circuit as the power distribution/coupling circuit 100 shown in FIG. 1. Then, the return loss and isolation of each power distribution/coupling circuit were examined.

Figure 14A:
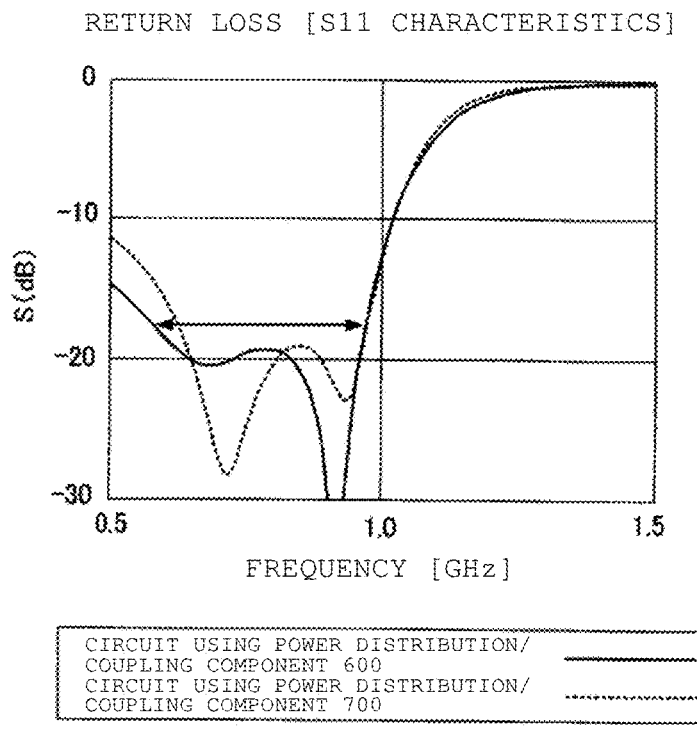
FIGS. 14A and 14B are graphs showing characteristics of a power distribution/coupling circuit using each of the power distribution/coupling component 600 and the power distribution/coupling component 700.
Figure 14B:
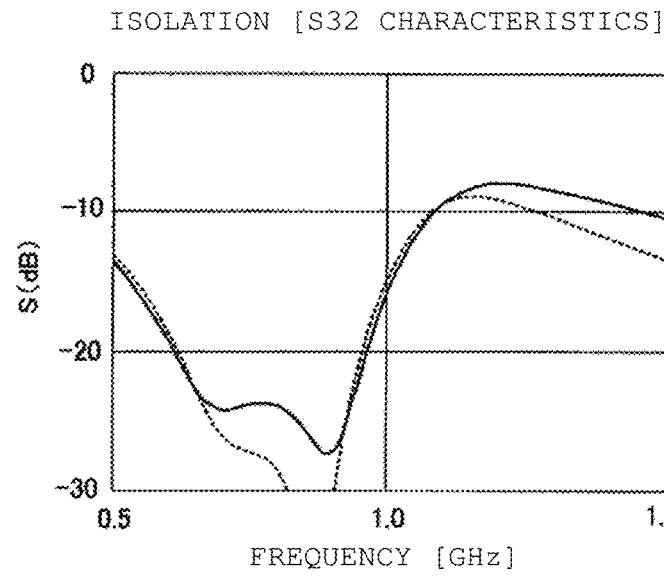
Figure 15:
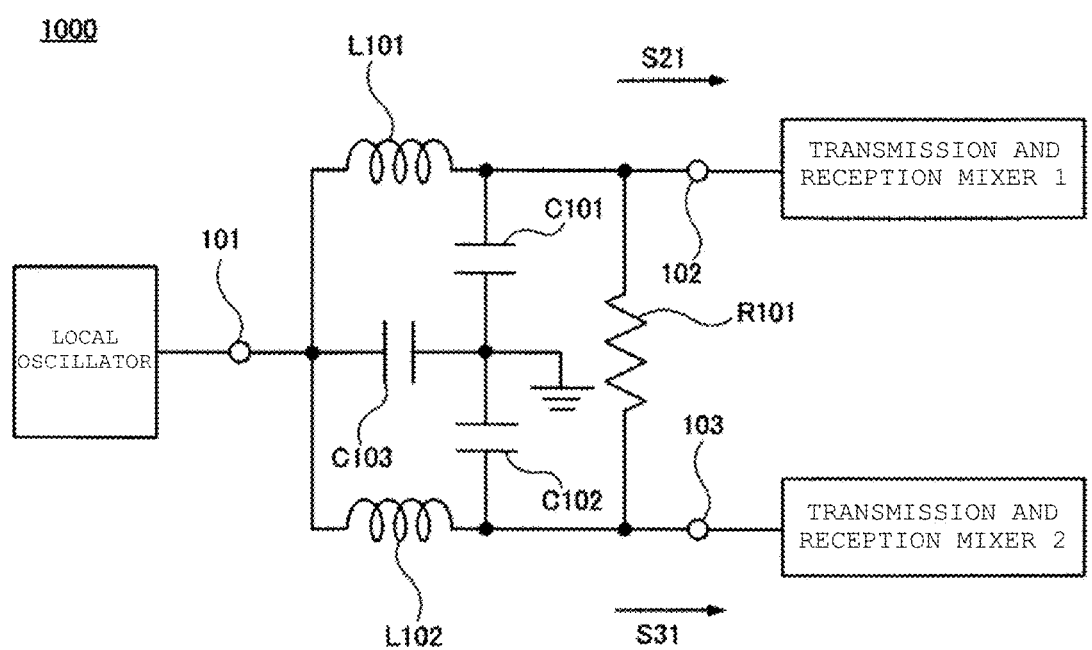
FIG. 15 is an equivalent circuit diagram of a power distribution/coupling component 1000 disclosed in Japanese Patent Application Laid-Open No. 2002-280864.

As for the return loss, FIG. 14A shows the S11 characteristics of the power distribution/coupling circuit using the power distribution/coupling component 600 with a solid line, and the S11 characteristics of the power distribution/coupling circuit using the power distribution/coupling component 700 with a broken line. Further, as for the isolation, FIG. 14B shows the S32 characteristics of the power distribution/coupling circuit using the power distribution/coupling component 600 with a solid line, and the S32 characteristics of the power distribution/coupling circuit using the power distribution/coupling component 700 with a broken line. However, the common terminal TC to which the external terminal 2*b* of each of the power distribution/coupling components 600 and 700 is connected is the first terminal, the first terminal T1 to which the external terminal 2*d* is connected is the second terminal, and the second terminal T2 to which the external terminal 2*f* is connected is the third terminal.

As can be seen from FIG. 14A, regarding the return loss, the return loss is smaller in a wide band in the power distribution/coupling circuit using the power distribution/coupling component 600 than in the power distribution/coupling circuit using the power distribution/coupling component 700. On the other hand, as can be seen from FIG. 14B, regarding isolation, in both of the power distribution/coupling circuit using the power distribution/coupling component 600 and the power distribution/coupling circuit using the power distribution/coupling component 700, good isolation is obtained. Therefore, in order to widen the band with a small return loss, it is preferable to set the winding directions of the first inductor and the second inductor as in the power distribution/coupling component 600 according to the fourth preferred embodiment, rather than as in the power distribution/coupling component 700 according to the fifth preferred embodiment.

The above description is of the power distribution/coupling circuit 100 and the power distribution/coupling component 200 according to the first preferred embodiment, the power distribution/coupling circuit 300 and the power distribution/coupling component 400 according to the second preferred embodiment, the power distribution/coupling circuit 500 according to the third preferred embodiment, the power distribution/coupling component 600 according to the fourth preferred embodiment, and the power distribution/coupling component 700 according to the fifth preferred embodiment. However, the present invention is not limited to the above-described preferred embodiments, and various modifications can be made in accordance with the gist of the present invention.

For example, the power distribution/coupling component 200 is used to define the power distribution/coupling circuit 100 in the first preferred embodiment, but the power distribution/coupling component 200 does not have to be used to define the power distribution/coupling circuit 100. That is, the power distribution/coupling circuit 100 can be configured using separate inductors, capacitors, and resistors without using the power distribution/coupling component 200. The same applies to the second preferred embodiment in which the power distribution/coupling circuit 300 is configured using the power distribution/coupling component 400.

Further, another circuit may be added to the power distribution/coupling circuits 100, 300, and 500. Also, the power distribution/coupling circuits 100, 300, and 500 may be changed to equivalently equal circuits.

Further, the materials, numbers, shapes, formation positions, and the like of the elements in the description of the power distribution/coupling components 200, 400, 600, and 700 are examples and can be changed as appropriate.

A power distribution/coupling circuit according to a preferred embodiment of the present invention is as described in the "Summary of the Invention". However, in the power distribution/coupling circuit, the first inductor and the second inductor may each include a plurality of divided inductors connected to each other, and the power distribution/coupling circuit may further include a fifth capacitor shunt-connected between at least one connection point between the divided inductors of the first inductor and the ground, and a sixth capacitor shunt-connected between at least one connection point between the divided inductors of the second inductor and the ground. In this case, isolation characteristics between the first terminal and the second terminal can be further improved.

Further, a seventh capacitor connected in parallel with a resistor may be further provided between the first terminal and the second terminal. In this case, the S32 characteristics can be shifted toward the low frequency.

Further, the power distribution/coupling component according to one preferred embodiment of the present invention is as described in the Summary of the Invention. However, in the power distribution/coupling component, the winding direction of the first inductor conductors and the winding direction of the second inductor conductors may be different from each other, and the winding direction of the third inductor conductors may be the same as the winding direction of either the first inductor conductors or the second inductor conductors. In this case, by converting the winding direction of the third inductor conductors and the winding direction of the first inductor conductors or the second inductor conductors, which have a different winding direction from the third inductor conductors, into an S shape, the electric current can flow smoothly from the third inductor conductors to the first inductor conductors or the second inductor conductors.

Further, a power distribution/coupling component according to another preferred embodiment of the present invention is as described in the "Summary of the Invention". However, in the power distribution/coupling component, the winding direction from the first end to the second end of the third inductor conductors may be the same as the winding direction of either the first inductor conductors or the second inductor conductors. In this case, by converting the winding direction of the third inductor conductors and the winding direction of the first inductor conductors or the second inductor conductors, which have a different winding direction from the third inductor conductors, into an S shape, the electric current can flow smoothly from the third inductor conductors to the first inductor conductors or the second inductor conductors.

Further, the air core portion of the first inductor conductors do not have to overlap with the connecting conductor, and the air core portion of the second inductor conductors do not have to overlap with the connecting conductor. In this case, the first inductor conductors and the second inductor conductors can generate a magnetic flux without being hindered by the connecting conductor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power distribution/coupling circuit comprising:
   a common terminal;
   a first terminal;
   a second terminal;
   a first connection point connected to the common terminal;
   a first inductor connected between the first connection point and the first terminal;
   a second inductor connected between the first connection point and the second terminal;
   a first capacitor shunt-connected between an end of the first inductor closer to the first terminal and a ground;
   a second capacitor shunt-connected between an end of the second inductor closer to the second terminal and the ground;
   a third capacitor shunt-connected between the first connection point and the ground; and
   a resistor connected between the first terminal and the second terminal; wherein
   the power distribution/coupling circuit is configured to distribute electric power input to the common terminal at the first connection point and output the electric power from the first terminal and the second terminal, or to couple the electric power input to the first terminal and the second terminal at the first connection point and output the electric power from the common terminal; and
   the power distribution/coupling circuit further includes a third inductor connected between the common terminal and the first connection point, and a fourth capacitor shunt-connected between an end of the third inductor closer to the common terminal and the ground.

2. The power distribution/coupling circuit according to claim 1, wherein
   the first inductor and the second inductor each include a plurality of inductors connected to each other; and
   the power distribution/coupling circuit further includes a fifth capacitor shunt-connected between at least one connection point between the plurality of inductors of the first inductor and the ground, and a sixth capacitor shunt-connected between at least one connection point between the plurality of inductors of the second inductor and the ground.

3. The power distribution/coupling circuit according to claim 2, further comprising a seventh capacitor connected in parallel with the resistor between the first terminal and the second terminal.

4. A power distribution/coupling component comprising:
   a multilayer body including a plurality of dielectric layers that are stacked in a stacking direction;
   a first inductor conductor and a second inductor conductor each including a winding axis in the stacking direction;
   a connecting conductor connecting a first end of the first inductor conductor and a first end of the second inductor conductor;
   a third inductor conductor including a winding axis in the stacking direction and a first end connected to the connecting conductor;
   a first capacitor conductor connected to a second end of the first inductor conductor;
   a second capacitor conductor connected to a second end of the second inductor conductor;
   a third capacitor conductor connected to the connecting conductor;
   a fourth capacitor conductor connected to a second end of the third inductor conductor; and
   a ground conductor; wherein
   the ground conductor generates a capacitance with each of the first capacitor conductor, the second capacitor conductor, the third capacitor conductor, and the fourth capacitor conductor; and
   when the multilayer body is viewed in a perspective plan view from the stacking direction, the first inductor conductor and the second inductor conductor each include an air core portion including the winding axis, the air core portion of the first inductor conductor does not overlap with the connecting conductor, and the air core portion of the second inductor conductor does not overlap with the connecting conductor.

5. The power distribution/coupling component according to claim 4, wherein
   a winding direction of the first inductor conductor and a winding direction of the second inductor conductor are different from one another; and a winding direction of the third inductor conductor is identical to the winding direction of one of the first inductor conductor or the second inductor conductor.

6. The power distribution/coupling component according to claim 4, wherein the plurality of dielectric layers are made of low temperature co-fired ceramic.

7. The power distribution/coupling component according to claim 4, wherein a directional identification mark is provided on an upper surface of the multilayer body.

8. The power distribution/coupling component according to claim 4, wherein the first, second, and third, inductor conductors, the connecting conductor, the first, second, third, and fourth capacitor conductors, and the ground conductor each include Cu.

9. A power distribution/coupling component:
a multilayer body including a plurality of dielectric layers that are stacked in a stacking direction;
a common external terminal;
a first external terminal;
a second external terminal;
a connecting conductor;
a first inductor conductor including a winding axis in the stacking direction, a first end connected to the connecting conductor, and a second end connected to the first external terminal;
a second inductor conductor including a winding axis in the stacking direction, a first end connected to the connecting conductor, and a second end connected to the second external terminal;
a third inductor conductor including a winding axis in the stacking direction, a first end connected to the common external terminal, and a second end connected to the connecting conductor;
a first capacitor conductor connected to the second end of the first inductor conductor;
a second capacitor conductor connected to the second end of the second inductor conductor;
a third capacitor conductor connected to the connecting conductor;
a fourth capacitor conductor connected to the first end of the third inductor conductor; and
a ground conductor; wherein
the ground conductor generates a capacitance with each of the first capacitor conductor, the second capacitor conductor, the third capacitor conductor, and the fourth capacitor conductor;
when the multilayer body is viewed in a perspective plan view from the stacking direction:
the first inductor conductor, the second inductor conductor, and the third inductor conductor each include an air core portion including the winding axis;
at least a portion of the air core portion of the third inductor conductor is sandwiched between the air core portion of the first inductor conductor and the air core portion of the second inductor conductor; and a winding direction from the first end to the second end of the first inductor conductor is different from a winding direction from the first end to the second end of the second inductor conductor; and
when a direction in which the air core portion of the first inductor conductor and the air core portion of the second inductor conductor are arranged is defined as an arrangement direction of the first inductor conductor and the second inductor conductor:
in the arrangement direction, the winding direction of an outermost first portion of the first inductor conductor and the winding direction of an outermost first portion of the second inductor conductor are an identical direction; and
the winding direction of a second portion of the first inductor conductor facing the first end of the first inductor conductor with the air core portion interposed between the second portion of the first inductor conductor and the first end of the first inductor conductor and the winding direction of a second portion of the second inductor conductor facing the first end of the second inductor conductor with the air core portion interposed between the second portion of the second inductor conductor and the first end of the second inductor conductor in a direction intersecting the arrangement direction at a right angle are inwardly opposing directions in the arrangement direction.

10. The power distribution/coupling component according to claim 9, wherein the winding direction from a first end to a second end of the third inductor conductor is identical to the winding direction of either the first inductor conductor or the second inductor conductor.

11. The power distribution/coupling component according to claim 9, wherein the air core portion of the first inductor conductor does not overlap with the connecting conductor, and the air core portion of the second inductor conductor does not overlap with the connecting conductor.

12. The power distribution/coupling component according to claim 9, wherein the plurality of dielectric layers are made of low temperature co-fired ceramic.

13. The power distribution/coupling component according to claim 9, wherein a directional identification mark is provided on an upper surface of the multilayer body.

14. The power distribution/coupling component according to claim 9, wherein each of the common terminal, the first terminal, and the second terminal has a three-layer structure including a baked Cu layer, a Ni plating layer, and a Sn plating layer.

15. The power distribution/coupling component according to claim 9, wherein the first, second, and third, inductor conductors, the connecting conductor, the first, second, third, and fourth capacitor conductors, and the ground conductor each include Cu.

* * * * *